United States Patent
Amano et al.

(10) Patent No.: US 6,482,704 B1
(45) Date of Patent: Nov. 19, 2002

(54) METHOD OF MANUFACTURING SILICON CARBIDE SEMICONDUCTOR DEVICE HAVING OXIDE FILM FORMED THEREON WITH LOW ON-RESISTANCES

(75) Inventors: Shinji Amano, Okazaki (JP); Eiichi Okuno, Motosu-gun (JP); Tsuyoshi Yamamoto, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/714,165

(22) Filed: Nov. 17, 2000

(30) Foreign Application Priority Data

Nov. 18, 1999 (JP) .................................. 11-328478
Oct. 11, 2000 (JP) ...................................... 2000-310865

(51) Int. Cl.⁷ ........................................... H01L 21/336
(52) U.S. Cl. ...................................... 438/285; 438/268
(58) Field of Search .................. 438/142, 268, 438/270, 285, 931, 143, 308, 477, 758, 767, 779, 787; 257/77, 631; 117/951

(56) References Cited

U.S. PATENT DOCUMENTS

| | | |
|---|---|---|
| 5,170,231 A | 12/1992 | Fujii et al. |
| 5,323,040 A | 6/1994 | Baliga |
| 5,399,515 A | 3/1995 | Davis et al. |
| 5,459,107 A | 10/1995 | Palmour |
| 5,698,472 A | * 12/1997 | Harris |
| 5,723,376 A | 3/1998 | Takeuchi et al. |
| 5,736,753 A | 4/1998 | Ohno et al. |
| 5,744,826 A | 4/1998 | Takeuchi et al. |
| 5,915,180 A | 6/1999 | Hara et al. |
| 5,976,936 A | 11/1999 | Miyajima et al. |
| 6,020,600 A | 2/2000 | Miyajima et al. |
| 6,028,012 A | * 2/2000 | Wang |
| 6,096,607 A | * 8/2000 | Ueno |

OTHER PUBLICATIONS

Baliga, "Critical Nature of Oxide/Interface Quality for SiC Power Devices", 8226 *Microelectronic Engineering* (Jun. 28, 1995), pp. 177–184.

Suzuki et al., "Thermal Oxidation of SiC and Electrical Properties of Al–SiO$_2$–SiC MOS Structure", *Japanese Journal of Applied Physics*, vol. 21, No. 4 (Apr. 1992), pp. 579–585.

Starr et al., "Furnace Atmosphere Changes During Purging" (Jan. 1977), pp. 12–13.

Ueno, "Effects of Cooling–Off Condition on the Oxidation Process in 6H–SiC", *Materials Science Forum*, vols. 264–268 (1998) pp. 845–848.

Alok et al., "Process Dependence of Inversion Layer Mobility in 4H–SiC Devices", ICSCRM 99 Abstracts (Oct. 10–15, 1999).

* cited by examiner

*Primary Examiner*—Keith Christianson
(74) *Attorney, Agent, or Firm*—Law Offices of David G. Posz

(57) ABSTRACT

In a method for manufacturing a silicon carbide semiconductor device including a gate oxide film formed on a surface channel layer, the gate oxide film is formed by a thermal oxidation treatment that is performed at conditions under which a recrystallization reaction between silicon dioxide ($SiO_2$) and carbon (C) occurs to produce silicon carbide (SiC) with a Gibbs free energy $G_3$ being negative. The recrystallization reaction is expressed by a chemical formula of $SiO_2 + 3C \rightarrow SiC + 2CO + G_3$. Accordingly, residual carbon can be reduced at an interface between the gate oxide film and the surface channel layer.

44 Claims, 14 Drawing Sheets

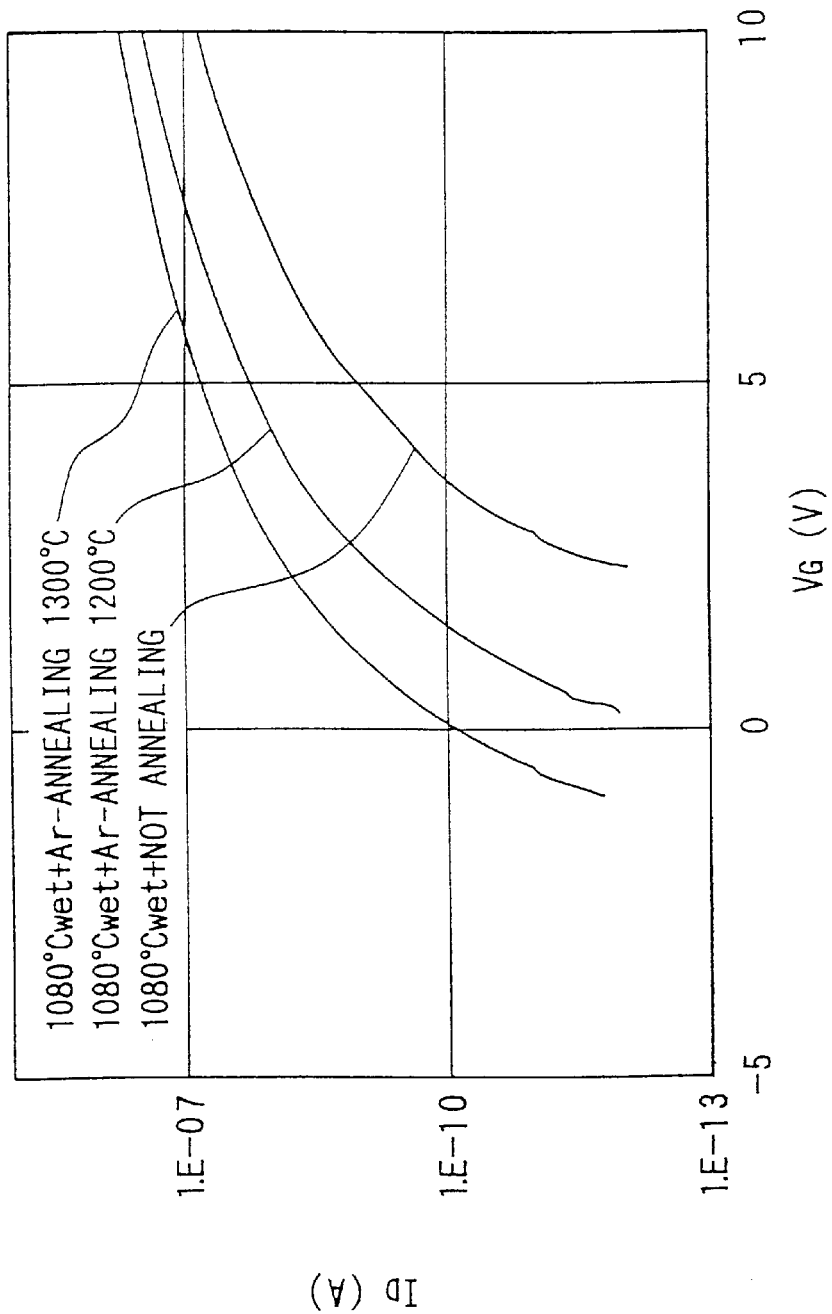

METHOD OF MANUFACTURING SILICON CARBIDE SEMICONDUCTOR DEVICE HAVING OXIDE FILM FORMED THEREON WITH LOW ON-RESISTANCES

CROSS REFERENCE TO RELATED APPLICATIONS

This application is based upon and claims the benefit of Japanese Patent Applications No. 11-328478 filed on Nov. 18, 1999, and No. 2000-310865 filed on Oct. 11, 2000, the contents of which are incorporated herein by reference.

BACKGROUND OF THE INVENTION

1. Field of the Invention

The present invention relates to a silicon carbide semiconductor device in which an oxide film is formed on a surface of silicon carbide. More particularly, the invention is well suited for application to insulated-gate field effect transistors, especially a vertical power MOSFET for high power.

2. Description of the Related Art

Heretofore, in field effect transistors of insulated gate type employing silicon carbide, it has been desired to lower ON-resistances.

A field effect transistor of insulated gate type intended to lower the ON-resistance has been proposed in, for example, the official gazette of Japanese Patent Laid-Open No. Hei. 10-308510. The conventional field effect transistor of insulated gate type disclosed in the official gazette is such that a semiconductor layer formed under a gate oxide film is used as an accumulation layer, whereby the MOSFET is operated in an accumulation mode inducing a channel, without inverting the conductivity type of a channel forming layer, so as to make a channel mobility higher than in an inversion mode. It is desired, however, to lower the ON-resistances of MOSFETs still further.

SUMMARY OF THE INVENTION

In view of the above, the present invention has for its object to attain further lowering of the ON-resistance in an insulated gate type field effect transistor formed from silicon carbide.

According to one aspect of the present invention, an oxide film is formed on a semiconductor layer made of silicon carbide by a thermal oxidation treatment that is performed at conditions under which a recrystallization reaction between silicon dioxide ($SiO_2$) and carbon (C) occurs to produce silicon carbide (SiC) with a Gibbs free energy $G_3$ being negative. The recrystallization reaction is expressed by a chemical formula of:

$SiO_2 + 3C \rightarrow SiC + 2CO + G_3$.

According to another aspect of the present invention, when an oxide film is formed on a semiconductor layer made of silicon carbide by a thermal oxidation treatment, an increase in thickness of the oxide film formed after performing the thermal oxidation treatment is controlled to be 6 nm at most.

According to another aspect of the present invention, after an oxide film is formed by a thermal oxidation treatment, an annealing treatment is performed at conditions under which the recrystallization reaction represented by the chemical formula of $SiO_2 + 3C \rightarrow SiC + 2CO + G_3$ occurs with a Gibbs free energy $G_3$ being negative.

According to still another aspect of the present invention, after an oxide film is formed on a semiconductor layer by deposition, a thermal oxidation treatment is performed at a temperature in a range of 1200° C. to 1400° C. In any aspect of the invention as described above, the ON-resistance can be lowered significantly. The reasons and detailed explanations are made hereinafter.

BRIEF DESCRIPTION OF THE DRAWINGS

Other objects and features of the present invention will become more readily apparent from a better understanding of the preferred embodiments described below with reference to the following drawings, in which;

FIG. 11 is a graph showing changes of $I_D$-$V_G$ characteristics of a lateral MOSFET in the case where the MOSFET is subjected to annealing treatments;

DETAILED DESCRIPTION OF THE PREFERRED EMBODIMENTS

Figure 1:
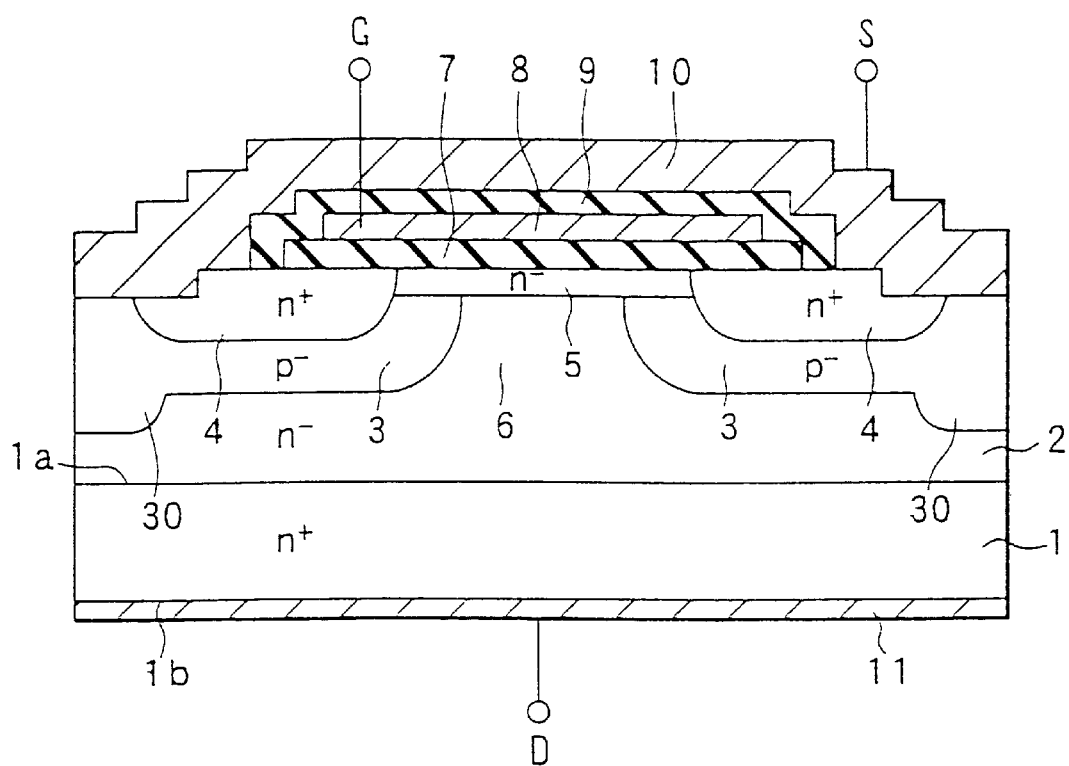
FIG. 1 is a cross-sectional view showing a planar MOS-FET in a first preferred embodiment of the present invention.

First, in order to lower an ON-resistance, a channel mobility that forms one factor determining the ON-resistance was studied as stated below.

It has heretofore been known that interface states between silicon carbide and a gate insulating film exert influence on the channel mobility. Enhancement in the channel mobility has been attained by improving the interface states. There is, for example, a technique in which the interface states between silicon carbide and the gate oxide film are improved in such a way that the state of a silicon carbide surface is improved by re-oxidizing the silicon carbide surface, whereupon the gate oxide film is formed on the silicon carbide surface.

A satisfactory channel mobility, however, could not be obtained even when trial manufacture and studies were made by employing the re-oxidation technique, with the intention of improving the interface states between the silicon carbide and the gate oxide film on the basis of the re-oxidation.

Therefore, a Dit density in the vicinity of the interface between the silicon carbide and the gate oxide film was investigated. Then, it has been revealed that the Dit density is high at the interface.

This was further studied. Then, it has been found out that the Dit characteristics of the interface resemble those of the $sp_2$ orbit of carbon. From this fact, it is conjectured that residual carbon exists at the interface between the silicon carbide and the gate oxide film, and that the residual carbon causes impurity scattering to form a factor for lowering the channel mobility and to incur the increase of the ON-resistance.

It has been reported that, even in the case of employing the known re-oxidation technique, the residual carbon at the interface between the silicon carbide and the gate oxide film can be decreased to about 5% of its quantity contained before the re-oxidation. It is considered, however, that the residual carbon still remaining in this case can affect the channel mobility. When the quantity of the residual carbon after the re-oxidation step was therefore calculated, it was about $10^{23}$ cm$^{-3}$. Besides, when the channel mobility in this case was investigated, it was as low as about 10. That is, although the effect of decreasing the residual carbon has been somewhat achieved by the re-oxidation, the effect is too low to suppress the impurity scattering and to attain the satisfactory channel mobility.

Therefore, further studies were subsequently made on the decreasing of the residual carbon for the purpose of lowering the channel mobility.

By way of example, when a gate oxide film is formed on a silicon carbide surface in a dry atmosphere, silicon carbide and oxygen in the atmosphere exhibit the following oxidation reactions:

$$SiC+2O_2 \rightarrow SiO_2+CO_2 \qquad \text{[Chem. Formula 1]}$$

$$SiC+3/2O_2 \rightarrow SiO_2+CO \qquad \text{[Chem. Formula 2]}$$

In a case where the oxidation reactions are not fully completed in the above chemical formulae, excess carbon is produced as follows:

$$SiC+O_2 \rightarrow SiO_2+C \qquad \text{[Chem. Formula 3]}$$

Carbon remains as indicated by the chemical formula 3, and this residual carbon is considered to form a cause for lowering the channel mobility. It is accordingly possible to say that enhancement in the channel mobility can be expected by decreasing the residual carbon. Here, a classical process for producing granular silicon carbide is a method wherein $SiO_2$ and graphite in a mixed state are heated to a high temperature (at least 1800° C.). Silicon-carbide recrystallization reactions on this occasion are given as follows:

$$SiO_2+3C \rightarrow SiC+2CO \qquad \text{[Chem. Formula 4]}$$

$$SiO_2+2C \rightarrow SiC+CO_2 \qquad \text{[Chem. Formula 5]}$$

Accordingly, when the chemical reaction indicated by the chemical formula 4 or 5 is caused to proceed at the interface between the silicon carbide and the gate oxide film, the residual carbon will be turned into SiC (silicon carbide) and carbon monoxide (CO) or carbon dioxide ($CO_2$) and will be removable from the interface between the silicon carbide and the gate oxide film. In addition, the above chemical formulae 1, 2, 4 and 5 are respectively expressed using Gibbs free energy G, as the following chemical formulae 6, 7, 8 and 9:

$$SiC+2O_2 \rightarrow SiO_2+CO_2+G_1 \qquad \text{[Chem. Formula 6]}$$

$$SiC+3/2O_2 \rightarrow SiO_2+CO+G_2 \qquad \text{[Chem. Formula 7]}$$

$$SiO_2+3C \rightarrow SiC+2CO+G_3 \qquad \text{[Chem. Formula 8]}$$

$$SiO_2+2C \rightarrow SiC+CO_2+G_4 \qquad \text{[Chem. Formula 9]}$$

Here, the Gibbs free energies G of the respective chemical formulae 6–9 are respectively computed as follows:

$$G^0_1 = -1232.6 \times 10^3 + 161.09(T+273)(J/mol) \qquad \text{[Equation 1]}$$

$$G^0_2 = -949.67 \times 10^3 + 72.02(T+273)(J/mol) \qquad \text{[Equation 2]}$$

$$G^0_3 = 624.96 \times 10^3 - 354.23(T+273)(J/mol) \qquad \text{[Equation 3]}$$

$$G^0_4 = 452.59 \times 10^3 - 173.24(T+273)(J/mol) \qquad \text{[Equation 4]}$$

In these equations, letter T denotes a temperature (°C.), and symbols $G^0_1$, $G^0_2$, $G^0_3$ and $G^0_4$ denote the Gibbs free energies in respective standard states. The words "standard state" termed here shall signify the state of a virtual ideal gas at 298.15 K and under 101325 Pa for a gas, and a pure state at 298.15 K and under 101325 Pa for a solid.

Figure 16:
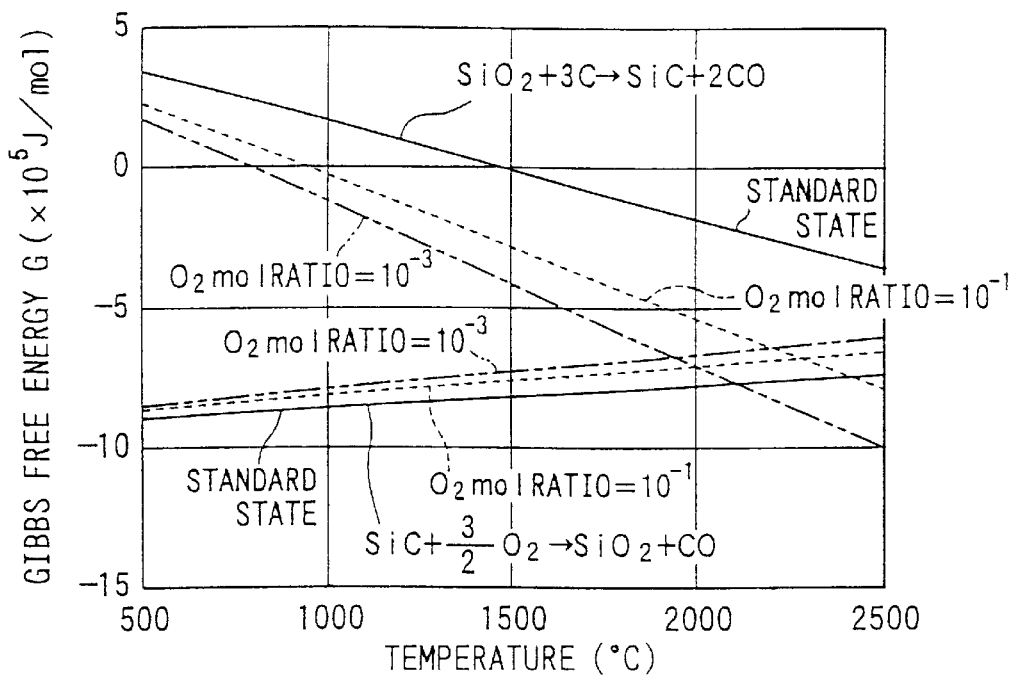
FIG. 16 is a graph showing oxygen mol ratio-dependencies of the Gibbs free energies of reactions indicated therein.
Figure 17:
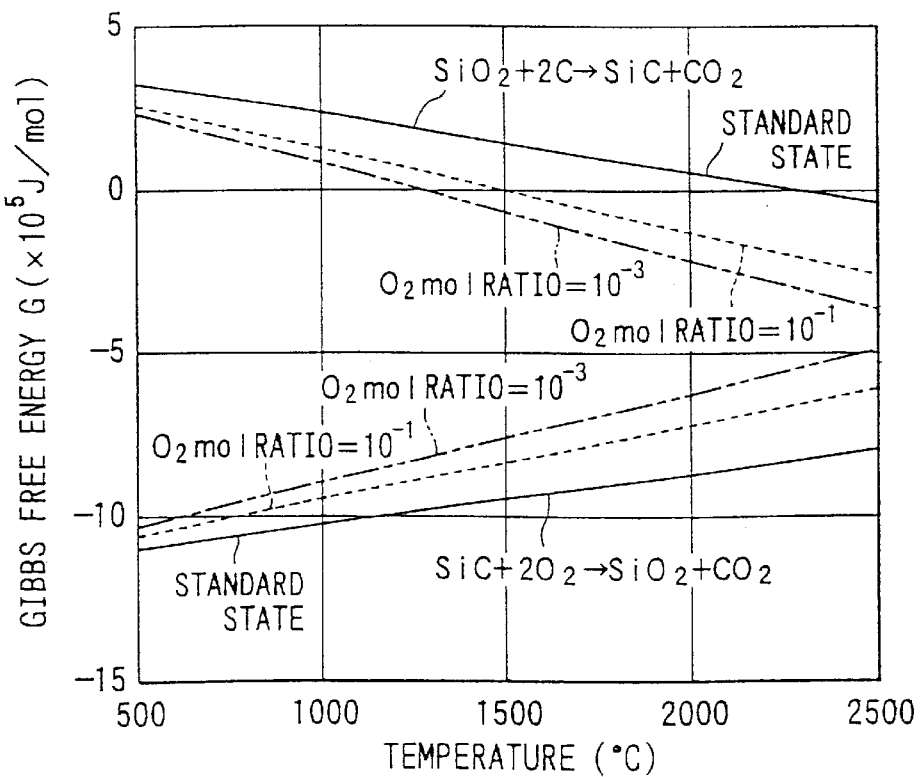
FIG. 17 is a graph showing oxygen mol ratio-dependencies of the Gibbs free energies of reactions indicated therein.

The temperature characteristics of the Gibbs free energies evaluated in accordance with the equations are graphically illustrated by solid lines in FIGS. 16 and 17. Here, FIG. 16 is a graph showing the temperature characteristics of the Gibbs free energies in the chemical formulae 7 and 8, while FIG. 17 is a graph showing the temperature characteristics of the Gibbs free energies in the chemical formulae 6 and 9. Each of these graphs demonstrates that, when the Gibbs free energy enters a minus range (below a line of zero indicated in the figure), the corresponding reaction is spontaneously generated. The spontaneous reaction becomes more active as the Gibbs free energy is lowered.

Meanwhile, a gate oxide film is usually formed at 1080° C. or so. At this temperature, only the reactions of the chemical formulae 6 and 7 proceed spontaneously. On these occasions, cases where the oxidation as in the chemical formula 3 is not perfected occur to produce the residual carbon.

In contrast, as respectively shown in FIGS. 16 and 17, the silicon-carbide recrystallization reactions expressed by the chemical formulae 8 and 9 (reactions between $SiO_2$ and carbon (C)) come to spontaneously proceed at temperatures higher than the usual temperature for forming the gate oxide film (for example, higher than about 1500° C. in the case of the reaction of the chemical formula 8). More specifically, the reaction of the chemical formula 8 or 9 is induced to turn the residual carbon into SiC and CO or $CO_2$, whereby the CO or $CO_2$ is emitted, and the SiC remains like silicon carbide originally existing under the gate insulating film. It is therefore permitted to sufficiently decrease the residual carbon at the interface between the silicon carbide and the gate oxide film. Incidentally, although the reactions which can occur during the dry oxidation (the reactions shown in FIGS. 16 and 17) have been exemplified here concerning the case of forming the gate oxide film by the dry oxidation, the same holds true also of wet oxidation.

In the case of the wet oxidation, the following oxidation reactions take place:

$SiC+3H_2O \rightarrow SiO_2+CO+3H_2$      [Chem. Formula 10]

$SiC+4H_2O \rightarrow SiO_2+CO_2+4H_2$      [Chem. Formula 11]

In a case where the oxidation reactions are not fully completed, excess carbon is produced as in the following reaction:

$SiC+2H_2O \rightarrow SiO_2+C+2H_2$      [Chem. Formula 12]

Silicon-carbide recrystallization reactions during the wet oxidation are the same as those indicated by the chemical formulae 4 and 5. Therefore, when the chemical reactions indicated by the chemical formulae 4 and 5 are caused to proceed at the interface between silicon carbide and a gate oxide film during the wet oxidation as in the case of the dry oxidation, the residual carbon can be removed from the interface between the silicon carbide and the gate oxide film as in the case of the dry oxidation.

In addition, the above chemical formulae 10 and 11 are respectively expressed using the Gibbs free energy G, as follows:

$SiC+3H_2O \rightarrow SiO_2+CO+3H_2+G_5$      [Chem. Formula 13]

$SiC+4H_2O \rightarrow SiO_2+CO_2+4H_2+G_6$      [Chem. Formula 14]

Figure 18:
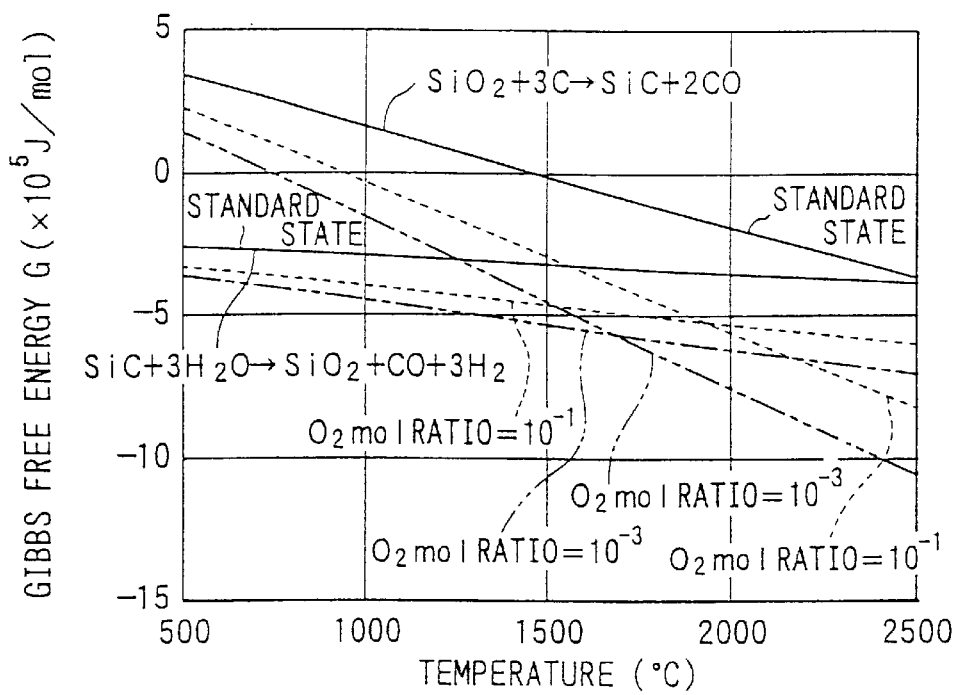
FIG. 18 is a graph showing oxygen mol ratio-dependencies of the Gibbs free energies of reactions indicated therein.
Figure 19:
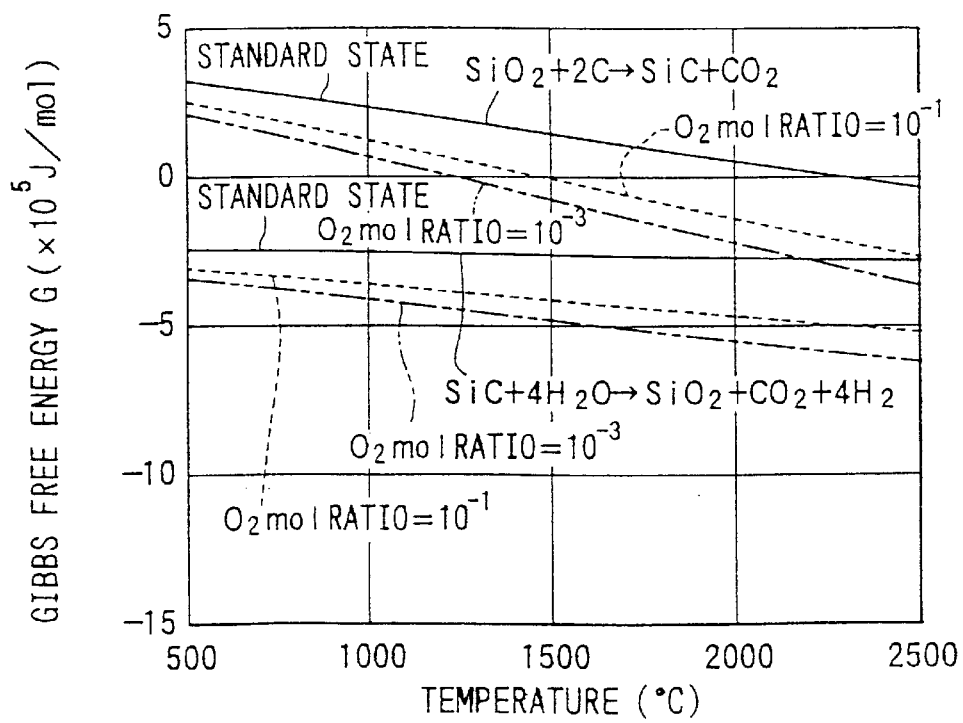
FIG. 19 is a graph showing oxygen mol ratio-dependencies of the Gibbs free energies of reactions indicated therein.

Incidentally, the reactions indicated by the chemical formulae 4 and 5 are respectively the same as the chemical formulae 8 and 9 when expressed using the Gibbs free energy G. The temperature characteristics of the free energies are graphically illustrated in FIGS. 18 and 19. Here, FIG. 18 is a graph showing the temperature characteristics of the Gibbs free energies in the chemical formulae 13 and 8, while FIG. 19 is a graph showing the temperature characteristics of the Gibbs free energies in the chemical formulae 14 and 9. It is understood from the figures that the same as in the dry oxidation holds true also of the wet oxidation. Also in the case of the wet oxidation, accordingly, the same effects as in the dry oxidation are attained when the reactions indicated by the chemical formulae 8 and 9 are caused to proceed spontaneously.

Incidentally, although the decreasing of the residual carbon at the interface between the gate oxide film and the silicon carbide has thus far been described, the same holds true also of the interface between any oxide film other than the gate oxide film and silicon carbide. By way of example, regarding an oxide film for element isolation such as LOCOS oxide film or STI (Shallow Trench Isolation) oxide film, or an oxide film which is formed on a guard ring or the like arranged at the outer periphery of a cell region, a withstand voltage is affected by the state of the interface between the oxide film and silicon carbide. Accordingly, the withstand voltage can be enhanced by bettering the interface state.

Meanwhile, a reaction temperature must be held higher than the temperature of an ordinary process for forming a gate oxide film, in order that the reaction of each of the chemical formulae 8 and 9 may proceed spontaneously. On the other hand, a temperature at which the gate oxide film can be stably existent (i.e., a temperature at which the film does not undergo fusion etc.) is one (about 1700° C.) lower than a temperature at which the reaction of the chemical formula 8 or 9 can proceed sufficiently actively. From the viewpoints of the available percentage of the gate oxide film, etc., therefore, it can be said unfavorable to set the reaction temperature at a very high one. In this regard, further studies were made.

Letting $[O_2]$ denote an oxygen mol ratio in the standard state, the Gibbs free energies in the chemical formulae 6–9 are respectively indicated in accordance with the equations 1–4, as follows:

$G_1=G^0{}_1+R(T+273)\ln[O_2]$      [Equation 5]

$G_2=G^0{}_2-1/2R(T+273)\ln[O_2]$      [Equation 6]

$G_3=G^0{}_3+2R(T+273)\ln[O_2]$      [Equation 7]

$G_4=G^0{}_4+R(T+273)\ln[O_2]$      [Equation 8]

Here, the equation 7 has been derived as stated below. The chemical formula 9 indicative of the reaction between silicon dioxide ($SiO_2$) and carbon (C) depends upon the mol ratio of carbon dioxide ($CO_2$) relative to the standard state. On the other hand, the greater part of carbon dioxide ($CO_2$) indicating the whole reaction system is produced by the oxidation reaction of silicon carbide (SiC) (chemical formula 6). The carbon-dioxide ($CO_2$) mol ratio $[CO_2]$ in the oxidation reaction is related with the oxygen ($O_2$) mol ratio $[O_2]$ and the chemical formula 9. Besides, at and near a reacting part, the chemical formula 9 is considered to lie in an equilibrium state, and hence, the carbon-dioxide ($CO_2$) mol ratio $[CO_2]$ agrees with the oxygen ($O_2$) mol ratio $[O_2]$. The equation 7 has been computed by substituting $[CO_2]=[O_2]$ from the above consideration. Also, the equation 8 has been derived in the same way.

As understood from the equations 5–8, the respective Gibbs free energies are changed by making the oxygen mol ratio smaller. Concretely, the Gibbs free energy of the oxidation reaction is shifted in a plus direction by making the oxygen mol ratio smaller, whereas the Gibbs free energy of the silicon-carbide recrystallization reaction is shifted in a minus direction by making the oxygen mol ratio smaller. The changes of the Gibbs free energies in the cases of making the oxygen mol ratio $[O_2]$ smaller are indicated by dotted lines and two-dot chain lines in FIGS. 16 and 17. Incidentally, the cases where $[O_2]=10^{-1}$ and $[O_2]=10^{-3}$ are held are illustrated here.

As seen from these figures, the Gibbs free energies turn minus at temperatures of or above about 1000° C. in the silicon-carbide recrystallization reaction indicated by the chemical formula 4 and at temperatures of or above about 1200° C. in the reaction indicated by the chemical formula 5, and the reactions come to occur spontaneously, respectively. Concretely, conditions under which the respective reactions indicated by the chemical formulae 4 and 5 come to occur spontaneously, that is, conditions under which the respective Gibbs free energies become minus, are found from the equations 7 and 8 and are expressed by the following equations:

$$624.96 \times 10^3 - 354.23(T+273) + 2R(T+273)\ln[O_2] \leq 0 \quad \text{[Equation 9]}$$

$$452.59 \times 10^3 - 173.24(T+273) + R(T+273)\ln[O_2] \leq 0 \quad \text{[Equation 10]}$$

It is permitted to make the Gibbs free energies minus by adjusting the oxygen mol ratio so as to meet the equations 9 and 10. Besides, it is found from the equations 9 and 10 that the oxygen mol ratio and the temperatures during heat treatments are correlative. The Gibbs free energies can therefore be made minus at or below the temperatures at which the gate oxide film can exist stably, by regulating the oxygen mol ratio.

Also, when the reactions of the chemical formulae 4 and 5 are spontaneously caused with the wet oxidation, the same as in the case of the dry oxidation holds true. Conditions under which the respective Gibbs free energies become minus in the case of the wet oxidation, can be found by the same method as that for the equations 9 and 10 and are expressed by the following equations:

$$624.96 \times 10^3 - 354.23(T+273) + 2R(T+273)\ln[H_2O] \leq 0 \quad \text{[Equation 11]}$$

$$452.59 \times 10^3 - 173.24(T+273) + R(T+273)\ln[H_2O] \leq 0 \quad \text{[Equation 12]}$$

Accordingly, when thermal oxidation conditions are set so as for the oxygen mol ratio $[O_2]$ to meet the condition indicated by the equation 9, the reaction of the chemical formula 8 can be spontaneously caused during the dry oxidation. Besides, when thermal oxidation conditions are set so as for the water-vapor mol ratio $[H_2O]$ to meet the condition indicated by the equation 11, the reaction of the chemical formula 8 can be spontaneously caused during the wet oxidation.

In addition, when the thermal oxidation conditions are set so as for the oxygen mol ratio $[O_2]$ to meet the condition indicated by the equation 10, the reaction of the chemical formula 9 can be spontaneously caused during the dry oxidation. Besides, when the thermal oxidation conditions are set so as for the water-vapor mol ratio $[H_2O]$ to meet the condition indicated by the equation 12, the reaction of the chemical formula 9 can be spontaneously caused during the wet oxidation. Further, when a heat treatment temperature is set at or above 1200° C., both the reactions of the chemical formulae 8 and 9 can be spontaneously caused.

Now, there will be described embodiments in which the present invention is applied to practicable semiconductor devices.

(First Embodiment)

FIG. 1 illustrates the sectional construction of a planar MOSFET of n-channel type (hereinbelow, termed "vertical power MOSFET") fabricated by applying one embodiment of the present invention. The construction of the vertical power MOSFET will be described with reference to FIG. 1 below.

An $n^+$-type substrate 1 made of silicon carbide is such that its upper surface is a principal surface 1a, and that its lower surface opposite to the principal surface 1a is a back surface 1b. The principal surface 1a of the $n^+$-type is overlaid with an $n^-$-type epitaxial layer (hereinbelow, termed "$n^-$-type epi layer") 2 made of silicon carbide which has a dopant concentration lower than that of the substrate 1.

On this occasion, each of the principal surface 1a of the $n^+$-type substrate 1 and the upper surface of the $n^-$-type epi layer 2 is a (0001) Si-face or ($11\bar{2}0$) a-face. The reason therefor is that a low surface state density is attained with the (0001) Si-face, or that a crystal which exhibits a low surface state density and which has quite no screw dislocation is obtained with the ($11\bar{2}0$) a-face.

A p-type base region 3 having a predetermined depth is formed in a predetermined region at the surface layer part of the $n^-$-type epi layer 2. The p-type base region 3 is formed using B (boron) as a dopant, and has a dopant concentration of, at least, about $1 \times 10^{17}$ cm$^{-3}$. Besides, an $n^+$-type source region shallower than the p-type base region 3 is formed in the predetermined region of the surface layer part of this base region 3.

Further, an $n^-$-type SiC layer 5 is extended in the surface part of the p-type base region 3 so as to join the $n^+$-type source region 4 and the $n^-$-type epi layer 2. The $n^-$-type SiC layer 5 is an epitaxial film formed by epitaxial growth, and has a crystal structure of 4H, 6H or 3C. Incidentally, the $n^-$-type SiC layer 5 functions as a channel forming layer during the operation of the device. This $n^-$-type SiC layer 5 shall be termed the "surface channel layer" below. The surface channel layer 5 is formed using N (nitrogen) as a dopant, and the dopant concentration thereof is a low concentration of, for example, about $1 \times 10^{15}$ cm$^{-3}$ to $1 \times 10^{17}$ cm$^{-3}$ and is not higher than the dopant concentration of the $n^-$-type epi layer 2 as well as the p-type base region 3. Thus, the ON-resistance of the device is lowered.

Besides, that part of the $n^-$-type epi layer 2 which lies between the opposing inner peripheral parts of the p-type base region 3 constructs a so-called J-FET portion 6. A gate oxide film 7 is formed on the upper surface of the surface channel layer 5 and that of the $n^+$-type source region 4 by thermal oxidation. Further, a poly-silicon gate electrode 8 is formed on the gate oxide film 7. The poly-silicon gate electrode 8 is covered with an insulating film 9. An LTO (Low Temperature Oxide) film is employed as the insulating film 9. A source electrode 10 is formed on the insulating film 9, and it is held in contact with the $n^+$-type source region 4 as well as the p-type base region 3. Besides, a drain electrode layer 11 is formed on the back surface 1b of the $n^+$-type substrate 1.

The planar MOSFET thus constructed is operated in an accumulation mode in which a channel is induced without inverting the conductivity type of the channel forming layer. It is therefore possible to heighten the channel mobility of the MOSFET and to lower the ON-resistance thereof, as compared with those of a MOSFET operable in an inversion mode in which the conductivity type is inverted. Besides, according to the vertical power MOSFET in this embodiment, residual carbon at the interface between the surface channel layer 5 and the gate oxide film 7 is decreased by a method to be stated below. Therefore, the channel mobility can be heightened still more, and the ON-resistance can be lowered still further.

The method of manufacturing the vertical power MOSFET in this embodiment will be described below. The steps of manufacturing the vertical power MOSFET of this embodiment are illustrated in FIG. 2A–FIG. 4C.

Figure 2A:
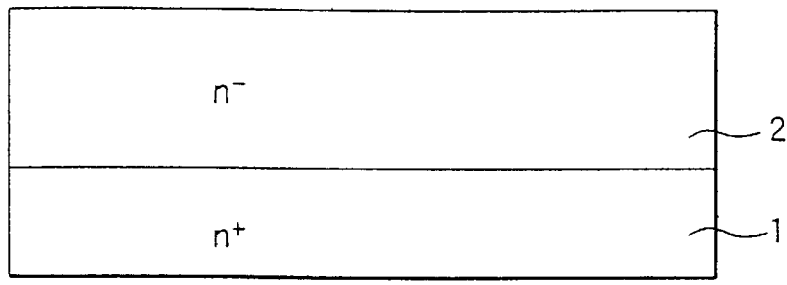
FIGS. 2A–2C are cross-sectional flow diagrams showing manufacturing steps of the MOSFET shown in FIG. 1.

[Steps shown in FIG. 2A]

First, an n-type substrate of 4H, 6H, 3C or 15R-SiC, that is, an $n^+$-type substrate 1 is prepared. Here, the $n^+$-type substrate 1 is 400 $\mu$m thick, and its principal surface 1a is a (0001) Si-face or ($11\bar{2}0$) a-face. An $n^-$ type epi layer 2 having a thickness of 5 $\mu$m is epitaxially grown on the principal surface 1a of the substrate 1. Here in this example, the n⁻-type epi layer 2 is formed as a crystal similar to that of the subbing substrate 1, and it becomes an n-type layer of 4H, 6H, 3C or 15R-SiC.

Figure 2B:
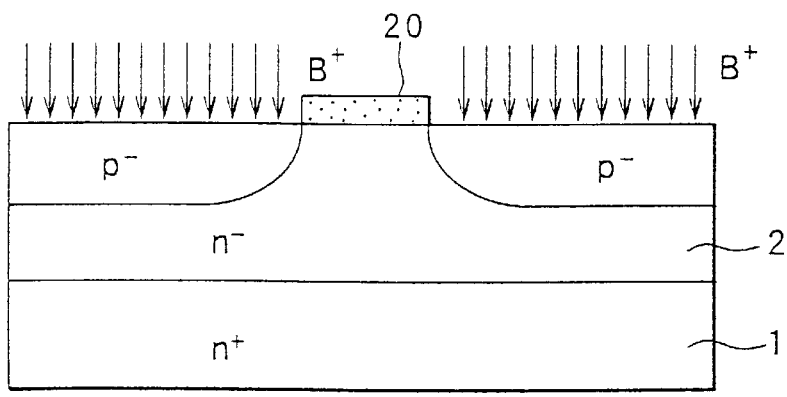

[Steps shown in FIG. 2B]

An LTO film 20 is arranged on the predetermined area of the n⁻-type epi layer 2, and boron ions B⁺ (or aluminum ions) are implanted using the LTO film 20 as a mask, thereby to form a p-type base region 3. The conditions of the ion implantation on this occasion are a temperature of 700° C. and a dose of $1 \times 10^{16}$ cm$^{-2}$.

Figure 2C:
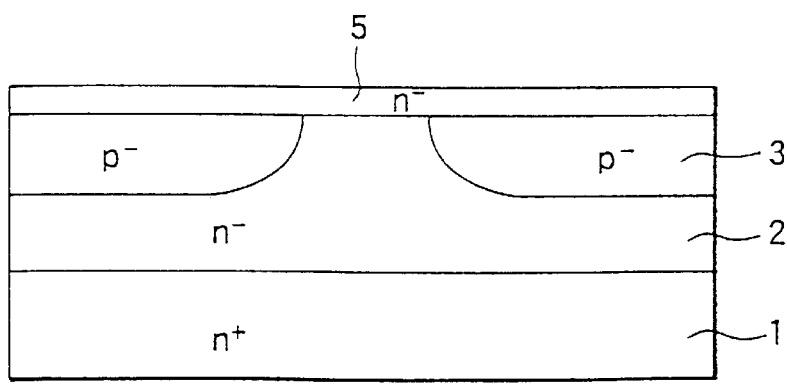

[Steps shown in FIG. 2C]

After removing the LTO film 20, a surface channel layer 5 is epitaxially grown on the surface part of the n⁻-type epi layer 2 and that of the p-type base region 3 by chemical vapor deposition (CVD). On this occasion, in order to make the vertical power MOSFET a normally-OFF type, the thickness (film thickness) of the surface channel layer 5 is determined on the basis of an equation 13 given below. For the purpose of constructing the normally-OFF type of the vertical power MOSFET, a depletion layer spreading in the surface channel layer 5 needs to have a barrier height enough to impede electric conduction, in a state where a gate voltage is not applied. Such a requirement is expressed by the following equation:

$$Tepi = \sqrt{\frac{2\varepsilon s}{q} \cdot \frac{N_D + N_A}{N_D N_A} \cdot V_{built}} + \sqrt{\frac{2\varepsilon s}{q} \cdot \frac{1}{N_D} \left( \phi ms - \frac{Qs + Qfc + Qi + Qss}{Cox} \right)}$$ [Equation 13]

Here, Tepi denotes the height of the depletion layer spreading in the surface channel layer 5, φms denotes the difference between the work functions of a metal and a semiconductor (the energy difference of electrons), Qs denotes space charges in a gate oxide film 7, Qfc denotes fixed charges of the interface between the gate oxide film (SiO₂) and the surface channel layer 5, Qi denotes mobile ions in the oxide film, Qss denotes surface charges of the interface between the gate oxide film 7 and the surface channel layer 5, and Cox denotes the capacitance of the gate insulating film 7.

The first term of the right side of the equation 13 indicates the extending magnitude of a depletion layer based on the built-in voltage V$_{built}$ of the PN-junction between the surface channel layer 5 and the p-type base region 3, that is, the extending magnitude of a depletion layer spreading from the p-type base region 3 into the surface channel layer 5. The second term indicates the extending magnitude of a depletion layer based on the charges of the gate insulating film 7 and the work function difference φms, that is, the extending magnitude of a depletion layer spreading from the gate insulating film 7 into the surface channel layer 5.

Accordingly, when the sum between the extending magnitude of the depletion layer spreading from the p-type base region 3 and the extending magnitude of the depletion layer spreading from the gate insulating film 7 is set to be at least equal to the thickness of the surface channel layer 5, the vertical power MOSFET can be operated as the normally-OFF type, and the surface channel layer 5 is formed under ion implantation conditions satisfying the requirement. Such a normally-OFF type vertical power MOSFET can prevent current from flowing even when it has fallen into a state where no voltage can be applied to a gate electrode, due to a fault or the like. Therefore, it can ensure a higher safety as compared with a MOSFET of normally-ON type.

Figure 3A:
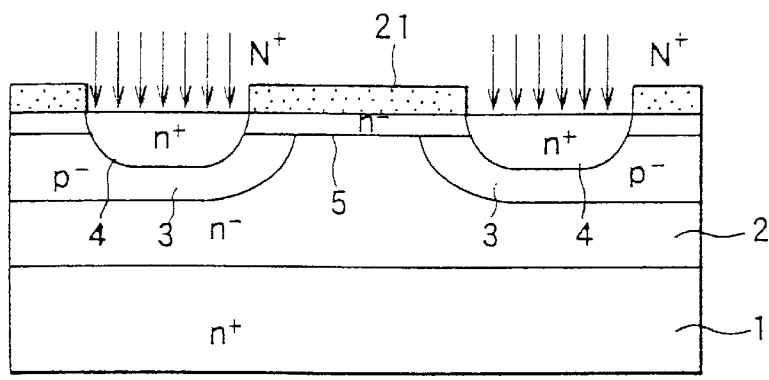
FIGS. 3A–3C are cross-sectional flow diagrams showing manufacturing steps of the MOSFET subsequent to those of FIGS. 2A–2C.

[Steps shown in FIG. 3A]

An LTO film 21 is arranged on the predetermined areas of the surface channel layer 5, and the ions of an n-type impurity such as N (nitrogen) are implanted using the LTO film 21 as a mask, thereby to form an n⁺-type source region 4. The conditions of the ion implantation on this occasion are a temperature of 700° C. and a dose of $1 \times 10^{16}$ cm$^{-2}$.

Figure 3B:
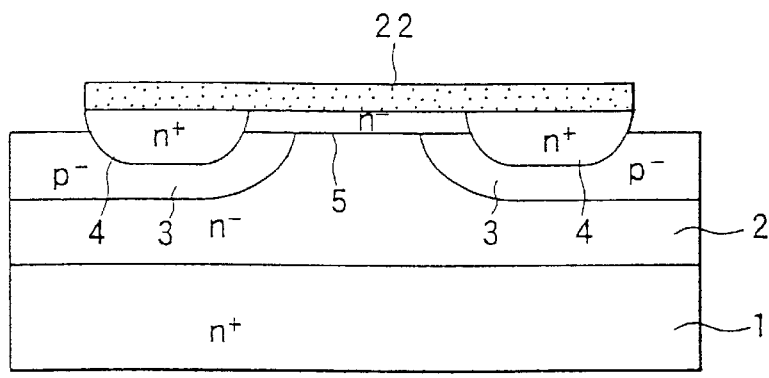

[Steps shown in FIG. 3B]

After removing the LTO film 21, an LTO film 22 is arranged on the predetermined areas of the surface channel layer 5 by employing a photoresist process, and the part of the surface channel layer 5 overlying the p-type base region 3 is etched and removed by RIE with the LTO film 22 used as a mask.

Figure 3C:
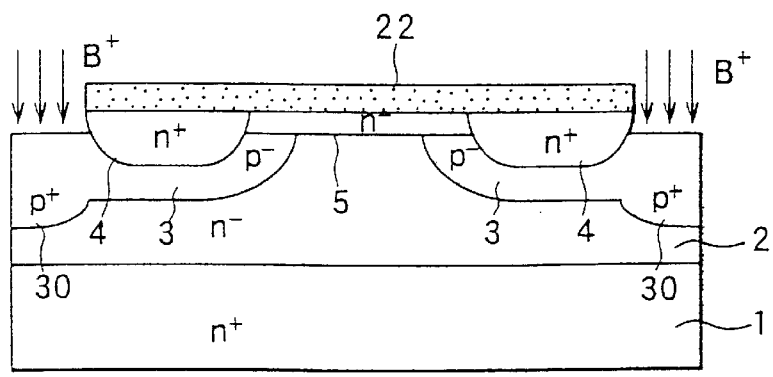

[Steps shown in FIG. 3C]

Subsequently, boron ions B⁺ are implanted using the LTO film 22 as a mask, thereby to form a deep base layer 30. Thus, the p-type base region 3 is partly thickened. The deep base layer 30 is formed at the part of the p-type base region 3 not overlapped with the n⁺-type source region 4, and the thicker part of the p-type base region 3 formed with the deep base layer 30 is endowed with an impurity concentration higher than that of the thinner part thereof not formed with the deep base layer 30.

Figure 4A:
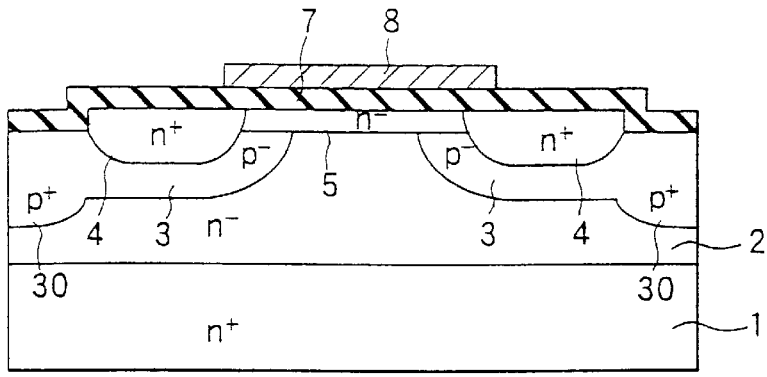
FIGS. 4A–4C are cross-sectional flow diagrams showing manufacturing steps of the MOSFET subsequent to those of FIGS. 3A–3C.

[Steps shown in FIG. 4A]

Further, after removing the LTO film 22, the gate oxide film 7 is formed on the resulting substrate by a heat treatment which is based on dry oxidation employing an oxygen atmosphere. On this occasion, an oxygen mol ratio [O₂] in an oxidation apparatus is set at 10$^{-3}$, and the temperature of the atmosphere is set at 1250° C.

When the gate oxide film 7 is formed in such an atmosphere, the silicon-carbide recrystallization reactions indicated by the chemical formulae 4 and 5 are both permitted to take place as explained with reference to FIGS. 16 and 17. Therefore, residual carbon which is produced at the interface between the gate oxide film 7 and the surface channel layer 5, etc. can be decreased during the formation of the gate oxide film 7. Thus, the channel mobility of the MOSFET can be enhanced, and the ON-resistance thereof can be lowered still further.

Thereafter, an annealing treatment is carried out as may be needed. According to the annealing treatment, the silicon-carbide recrystallization reactions indicated by the chemical formulae 4 and 5 are induced, and the residual carbon which lies at the interface between the gate oxide film 7 and the surface channel layer 5, etc. is decreased still further. In the annealing treatment, inert gas is used as an atmosphere, and an ambient temperature is set to be equal to or higher than that of the above thermal oxidation. Nitrogen, helium, argon or the like can be employed as the inert gas. It is also possible to employ hydrogen instead of the inert gas, or to employ a mixed gas in which hydrogen is added to the inert gas. Besides, if necessary, oxygen (O₂) or water vapor (H₂O) may well be mixed, or silane (SiH₄) may well be mixed.

Owing to such an annealing treatment, it is permitted to induce the silicon-carbide recrystallization reactions indicated by the chemical formulae 4 and 5 and to decrease the residual carbon. Thus, the residual carbon can be decreased still further, the channel mobility can be more enhanced, and the ON-resistance can be lowered. Thereafter, a poly-silicon layer is formed on the gate oxide film 7 by LPCVD. A film forming temperature on this occasion is set at 600° C. Next, the poly-silicon layer is patterned to form the gate electrode 8.

Figure 4B:
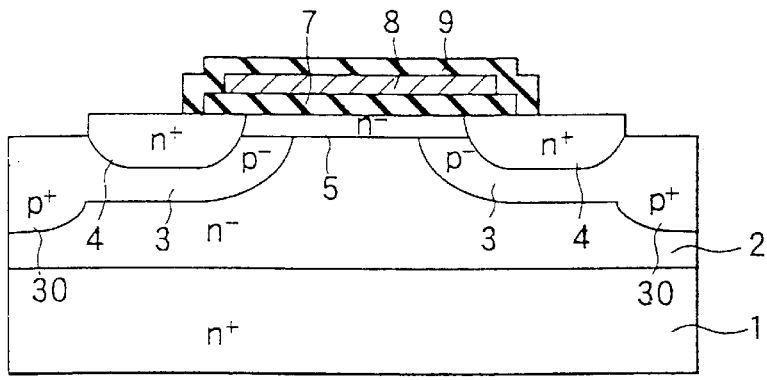

[Steps shown in FIG. 4B]

Subsequently, the unnecessary part of the gate oxide film 7 is removed, and an insulating film 9 made of an LTO is formed to cover the gate electrode 8 and the gate oxide film 7. More specifically, a temperature for forming the insulating film 9 is 425° C., and annealing at 1000° C. is performed after the film formation.

Figure 4C:
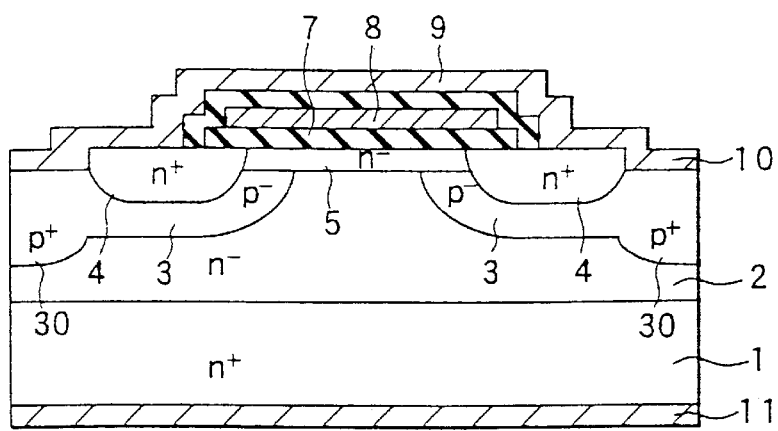

[Steps shown in FIG. 4C]

Besides, a source electrode 10 and a drain electrode 11 are arranged by metal sputtering at a room temperature. Also, annealing at 1000° C. is performed after the formation of the electrodes 10 and 11. The MOSFET shown in FIG. 1 is finished up in this way.

(Second Embodiment)

When the temperature inside the oxidation apparatus is lowered after the thermal oxidation or annealing treatment, the spontaneous silicon carbide recrystallization reactions indicated by the chemical formulae 4 and 5 could not be induced at such a lowered temperature in the apparatus. In that case, a case can be supposed, in that the residual carbon formed in the interface between the gate oxide film 7 and the surface channel layer 5 increases.

Figure 5B:
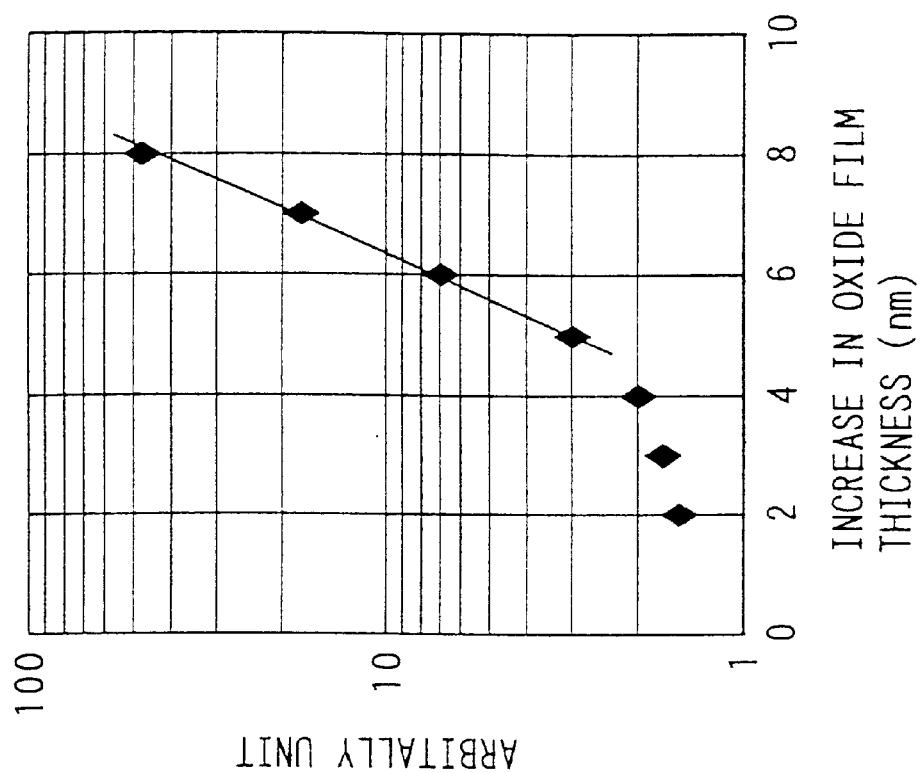
FIGS. 5A and 5B are graphs obtained by investigating a relationship between an increase in thickness of an oxide film and an interface state density, in a second preferred embodiment of the present invention.
Figure 5A:
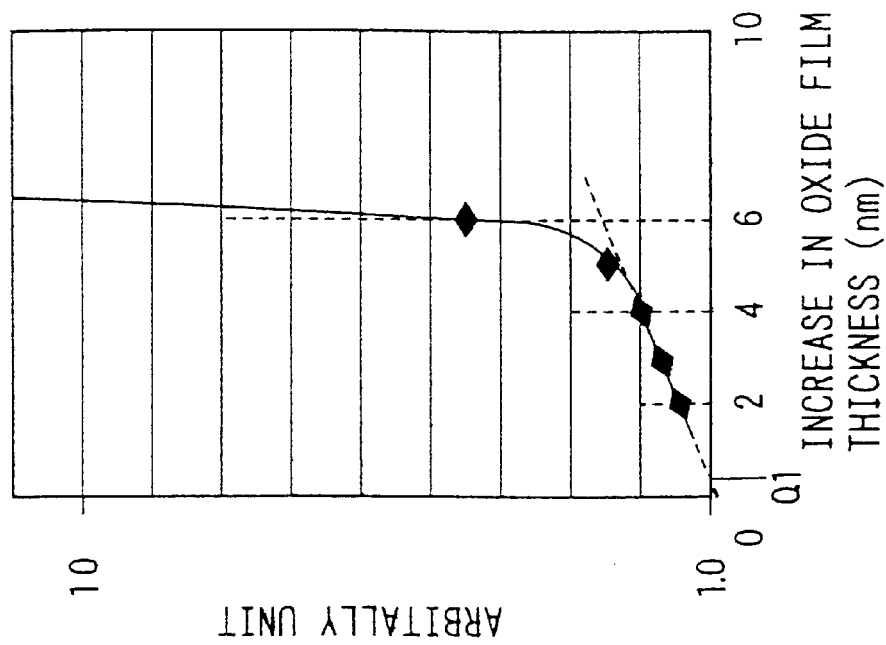

In this connection, a relationship between an increase in an oxide film thickness and an interface state density was studied while lowering a temperature in an oxidation apparatus with oxidizing gas remaining therein after silicon carbide was thermally oxidized at 1250° C. in the oxidation apparatus. The results are shown in FIG. 5A and FIG. 5B, which are a linear-plotted graph and a log-plotted graph, respectively.

As shown in these figures, it is understood that the thickness of the oxide film increases when the temperature in the oxidation apparatus is lowered and that the interface state density increases according to the increased amount. This is because the interface between the final silicon carbide and the oxide film is formed in a range in which the silicon carbide recrystallization reactions represented by the chemical formulae 4 and 5 could not spontaneously occur, and much residual carbon remains at the interface in that condition.

Accordingly, this embodiment is made to prevent the residual carbon from increasing at the interface between the gate oxide film 7 and the surface channel layer 5 when the temperature in the oxidation apparatus is lowered after the thermal oxidation or annealing treatment. One method of this embodiment for fabricating a silicon carbide semiconductor device is described below. In this, the process to reach the thermal oxidation or annealing treatment is substantially the same as in the first embodiment, and its description is omitted herein.

Through the process comprising the step of FIG. 2A to the step of FIG. 4A as in the first embodiment, the gate oxide film 7 is formed by the thermal oxidation treatment, and is annealed as required.

After that, a cooling step is performed as an oxidation stop step, whereby at least the $n^+$-type substrate 1 in the oxidation apparatus is rapidly cooled. The rapid cooling can be performed by, for example, adopting a lamp heating unit suitable for rapid heating and rapid cooling, for the oxidation apparatus; or cooling an oxidation core (furnace tube) in the oxidation apparatus with air or water; or spraying coolant gas such as inert gas, fluorine gas or the like to the $n^+$-type substrate 1.

Concretely, as shown in FIG. 5A and FIG. 5B, when the increase in thickness of the oxide film becomes 6 nm, the inclination indicating the increase in the interface state density becomes noticeable, and the interface state density increases exponentially. Therefore, the rapid cooling is performed so that the oxide film formed is at most 6 nm in thickness. In case where the thermal oxidation or annealing treatment is effected at 1200° C. or higher, the temperature in the oxidation apparatus shall be cooled to 900° C. or lower within 10 minutes after the thermal oxidation or annealing treatment.

Rapidly cooling the oxidation apparatus after the thermal oxidation or annealing treatment enables rapidly stopping the oxidation within a short period of time. As a result, the thickness of the oxide film that is formed while the oxidation apparatus is cooled can be reduced as thin as possible, and the amount of residual carbon formed at the interface between the gate oxide film 7 and the surface channel layer 5 can be minimized. Accordingly, the channel mobility of the semiconductor device can be enhanced, and the ON-resistance thereof can be lowered.

As in this embodiment, the cooling step may be effected in the same apparatus in which the thermal oxidation or annealing treatment is carried out. Apart from this, however, these treatments may be performed in different apparatuses. For example, the $n^+$-type substrate 1 having been thermally oxidized or annealed may be moved from the oxidation apparatus into a different apparatus kept at a lower temperature than that in the oxidation apparatus. Accordingly, rapid cooling can be performed with ease. If desired, coolant gas (e.g., inert gas such as $N_2$, Ar, He or the like) may be sprayed over the $n^+$-type substrate 1.

In this embodiment, the oxidation apparatus is cooled to 900° C. within a short period of time of 10 minutes, whereby the increase in the oxide film thickness is at most 6 nm. In case where the substrate is cooled to the indicated temperature within 3 minutes, the increase in the oxide film thickness can be at most 2 nm.

(Third Embodiment)

In this embodiment, the residual carbon formed at the interface between the gate oxide film 7 and the surface channel layer 5 after the thermal oxidation or annealing treatment is prevented from increasing according to a method different from that in the second embodiment. A method for fabricating a silicon carbide semiconductor device in this embodiment is described below. In this, the process to reach the thermal oxidation or annealing treatment is substantially the same as those in the first embodiment, and its description is omitted herein.

Through the process comprising the step of FIG. 2A to the step of FIG. 4A as in the first embodiment, the gate oxide film 7 is formed by the thermal oxidation treatment and is annealed if necessary. After that, an inner pressure controlling step is performed as an oxidation stop step, in which a partial pressure of oxidizing gas (inner pressure) in the oxidation apparatus is controlled to be lower than that therein in the thermal oxidation treatment, while the temperature in the apparatus is still kept at 1200° C. or higher. Concretely, the partial pressure of the oxidizing gas in the oxidation apparatus is controlled in the manner mentioned below.

Figure 6A:
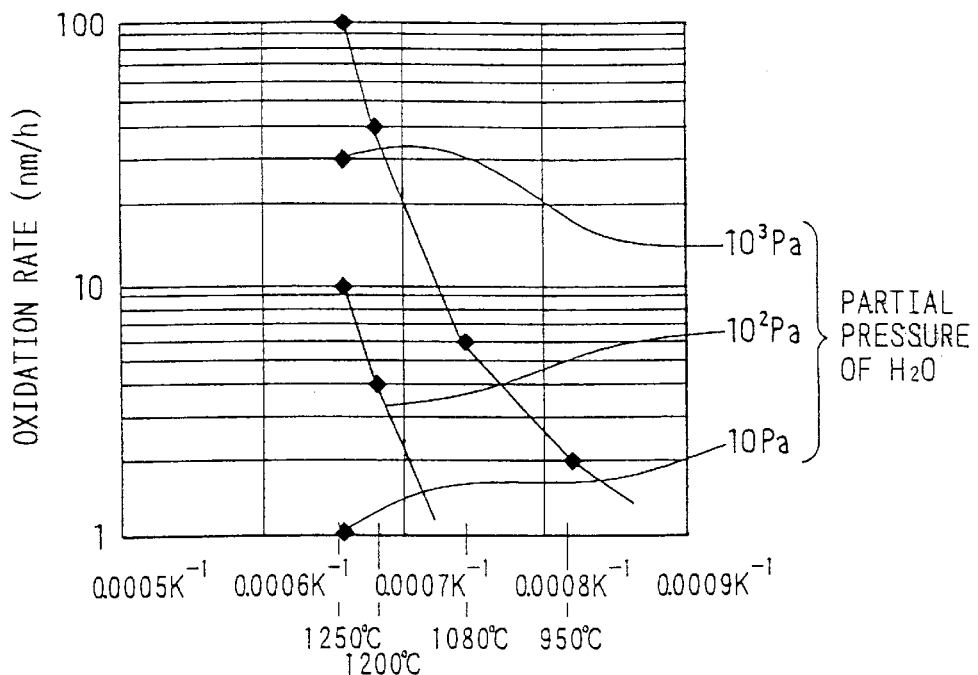
FIGS. 6A and 6B are graphs showing relationships among a partial pressure of an oxidizing gas (partial pressure of $H_2O$), an oxidation rate and an oxidation temperature during wet oxidation, and a relationships among a partial pressure of an oxidizing gas (partial pressure of $O_2$), an oxidation rate and an oxidation temperature during dry oxidation, in a third preferred embodiment of the present invention, respectively.
Figure 6B:
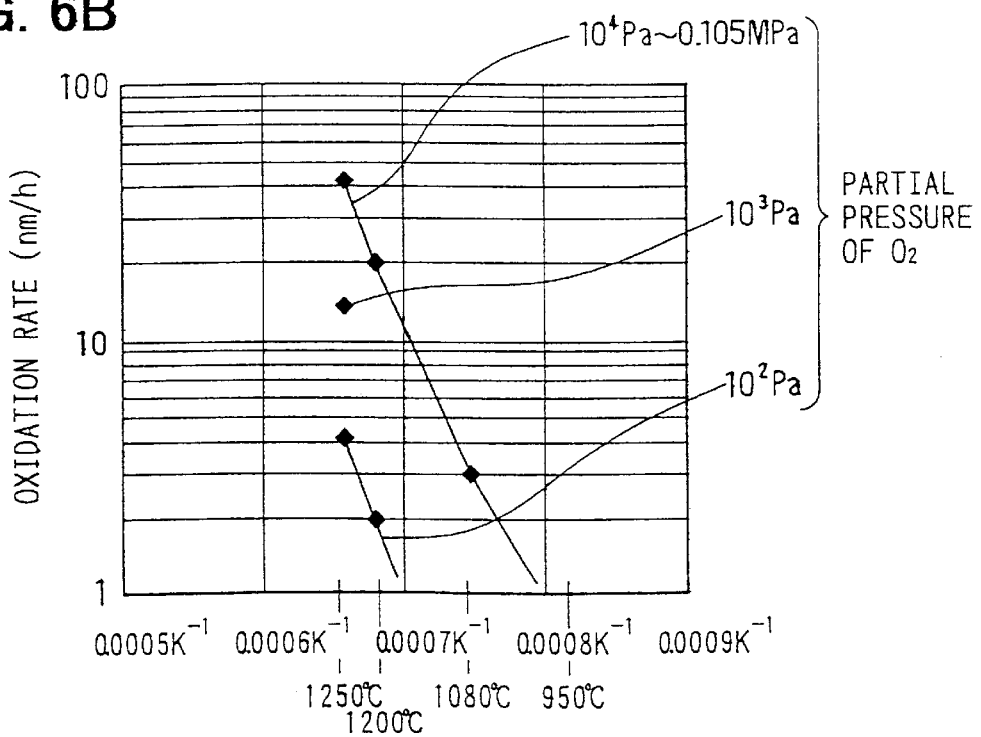

FIGS. 6A and 6B show the relationships among the partial pressure of the oxidizing gas ($H_2O$ partial pressure), the oxidation rate, and the oxidation temperature in wet oxidation, and the relationships among the partial pressure of the oxidizing gas ($O_2$ partial pressure), the oxidation rate, and the oxidation temperature in dry oxidation, respectively.

In these figures, when the partial pressure of $H_2O$ or $O_2$ falling in a range of $10^4$ Pa to 0.105 MPa, it is a normal pressure, that is, a pressure in the oxidation apparatus during the thermal oxidation or annealing treatment. From these figures, it is understood that, when the partial pressure of $H_2O$ or $O_2$ in the apparatus is about $1/100$ of the normal pressure, for example, at 1200° C. or higher, then the oxidation rate reduces to about 1/10 of that at the normal pressure. That is, lowering the partial pressure of $H_2O$ or $O_2$ in the oxidation apparatus retards the formation of the oxide film therein.

By lowering the partial pressure of the oxidizing gas in the oxidation apparatus in the manner as above, the oxide film thickness is controlled to at most 6 nm, as in FIG. 5A and FIG. 5B referred to for the second embodiment. As a result, the thickness of the oxide film that is formed after the thermal oxidation or annealing treatment can be reduced, and, in addition, the amount of residual carbon formed at the interface between the gate oxide film 7 and the surface channel layer 5 can be minimized.

Figure 7A:
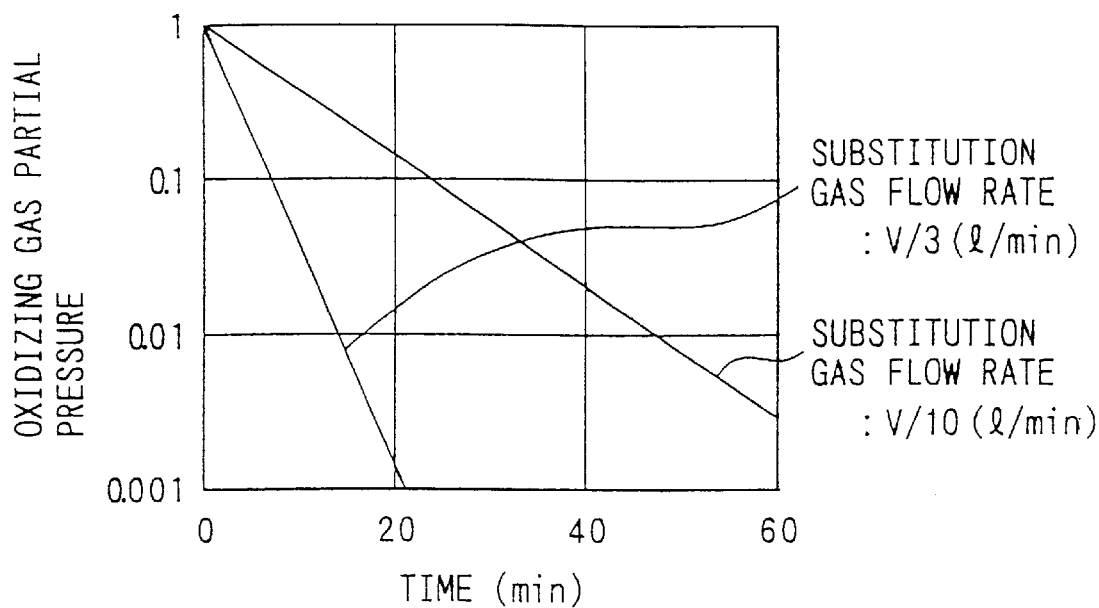
FIG. 7A is a graph showing relationships of the ratio of the partial pressure of the oxidizing gas in an oxidation apparatus, to the pressure lowering time of the partial pressure of the oxidizing gas.
Figure 7B:
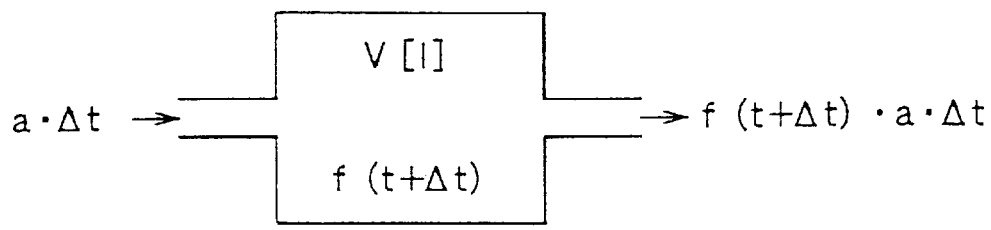
FIG. 7B is a model diagram explanatory of a method for obtaining the relationships shown in FIG. 7A.

FIG. 7A shows oxidizing gas partial pressures in the oxidation apparatus with respect to time reducing the oxidizing gas partial pressure. Referring to FIG. 7B, the volume of the oxidation apparatus is assumed to be V (liter). When injection gas (100% inert gas of, for example, nitrogen, argon, or helium) other than the oxidizing gas is introduced into the apparatus at a flow rate of "a" (liter/min) within a period of "$\Delta t$" (min), the oxidizing gas concentration in the oxidation apparatus is momentarily unified, and is indicated by its function $f(t+\Delta t)$, while the concentration of the oxidizing gas to be expelled from the apparatus is represented by $f(t+\Delta t) \cdot a \cdot \Delta t$. With that, the following equation 14 is derived:

$$f(t+\Delta t) = \{f(t)V - f(t+\Delta t) \cdot a \cdot t\}/V \quad \text{[Equation 14]}$$

The equation 14 may be made up for the function $f(t+\Delta t)$ as follows:

$$f(t+\Delta t) = f(t)V/\{V(1+a \cdot \Delta t/V)\} \quad \text{[Equation 15]}$$

Solving the differential equation 15 gives the result shown in FIG. 7A. FIG. 7A shows cases where the flow rates of the injection gas (substitution gas) are set to V/3 (liter/min) and V/10 (liter/min).

From this figure, it is understood that the time necessitated to lower the partial pressure of the oxidizing gas in the oxidation apparatus to about 1/100 is about 45 minutes when the flow rate of the injection gas is V/10, and is about 15 minutes when the flow rate thereof is V/3. From FIG. 6A and FIG. 6B, it is understood that the thickness of the oxide film that is formed during that period of time is at most about 6 nm in case where the temperature in the oxidation apparatus is kept at 1200° C. or higher.

Thus, the thickness of the oxide film that is formed after the thermal oxidation or annealing treatment could be reduced to at most 6 nm by controlling the flow rate of the injection gas to be introduced into the oxidation apparatus in consideration of the temperature in the apparatus and the oxidation rate therein. In consequence, the same effect as those in the second embodiment can be attained also in this embodiment.

Figure 8:
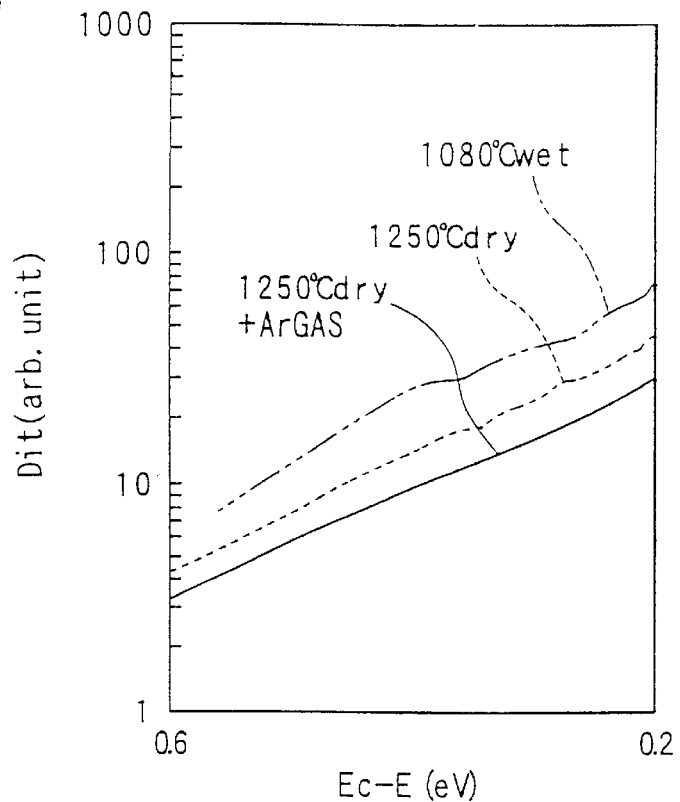
FIG. 8 is a graph showing relationships between energy Ec-E (eV) from a conduction band and interface states.

For reference, FIG. 8 shows the data obtained by studying the relationship between the energy Ec-E (eV) from the conduction band and the interface state density. As shown in this figure, the interface state density is lower in dry oxidation at 1250° C. than that in wet oxidation at 1080° C. It is considered that this is because an amount of electron traps caused by residual carbon is reduced. Substituting the oxidizing gas with Ar gas to lower the partial pressure of the oxidizing gas reduces the interface state density further as compared to that in dry oxidation at 1250° C. Thus, the interface state density can be still further reduced by this embodiment.

In this embodiment, inert gas is introduced into the oxidation apparatus to substitute the oxidizing gas with the inert gas, thereby lowering the partial pressure of the oxidizing gas in the apparatus. Apart from this, the oxidizing gas may be discharged from the oxidation apparatus to lower the pressure in the apparatus. Otherwise, inert gas may be sprayed over the $n^+$-type substrate 1 to thereby control the partial pressure of the oxidizing gas around the $n^+$-type substrate 1.

As in this embodiment, the partial pressure of the oxidizing gas may be reduced in the oxidation apparatus in which the thermal oxidation or annealing treatment is carried out. Apart from this, the $n^+$-type substrate 1 having been thermally oxidized or annealed in the oxidation apparatus may be moved from the apparatus into a different apparatus in which the partial pressure of the oxidizing gas is lower than that in the oxidation apparatus. In that manner, the partial pressure of the oxidizing gas can be reduced more easily.

(Fourth Embodiment)

This embodiment differs from the first to third embodiments mentioned above, in that an oxidation temperature, an oxidation atmosphere and an annealing temperature after oxidation are varied to further improve a MOS interface. One method for fabricating a MOSFET in this embodiment is described hereinafter with reference to FIG. 9 to FIG. 12.

Figure 10:
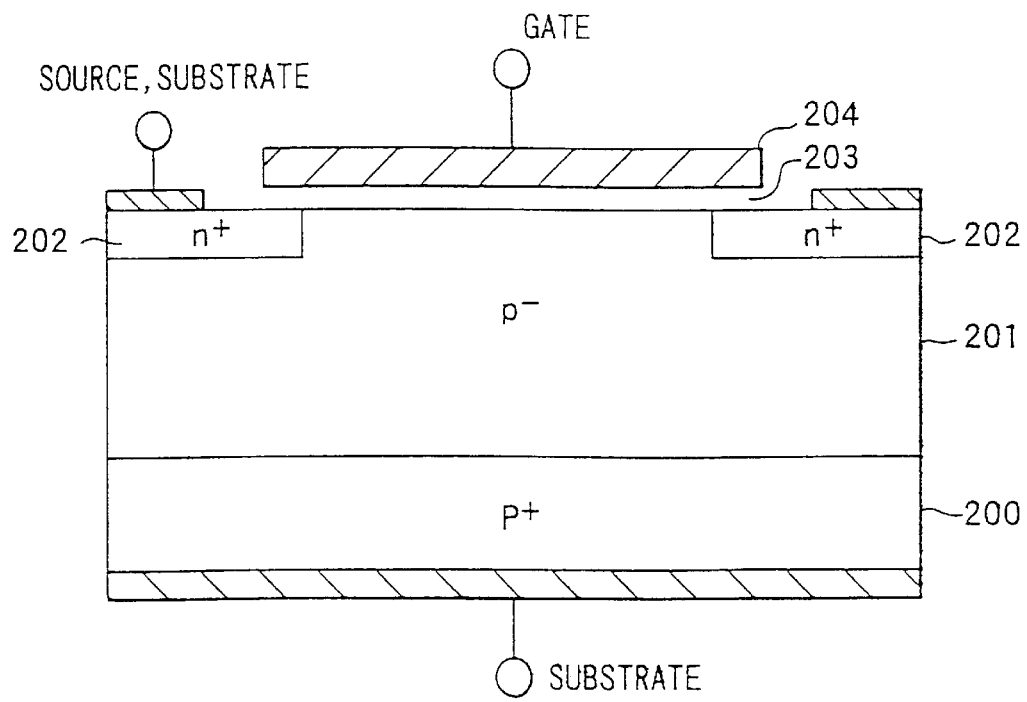
FIG. 10 is a cross-sectional view showing each construction of the MOS diodes used for the inspection of the C-V characteristics shown in FIG. 9.
Figure 9:
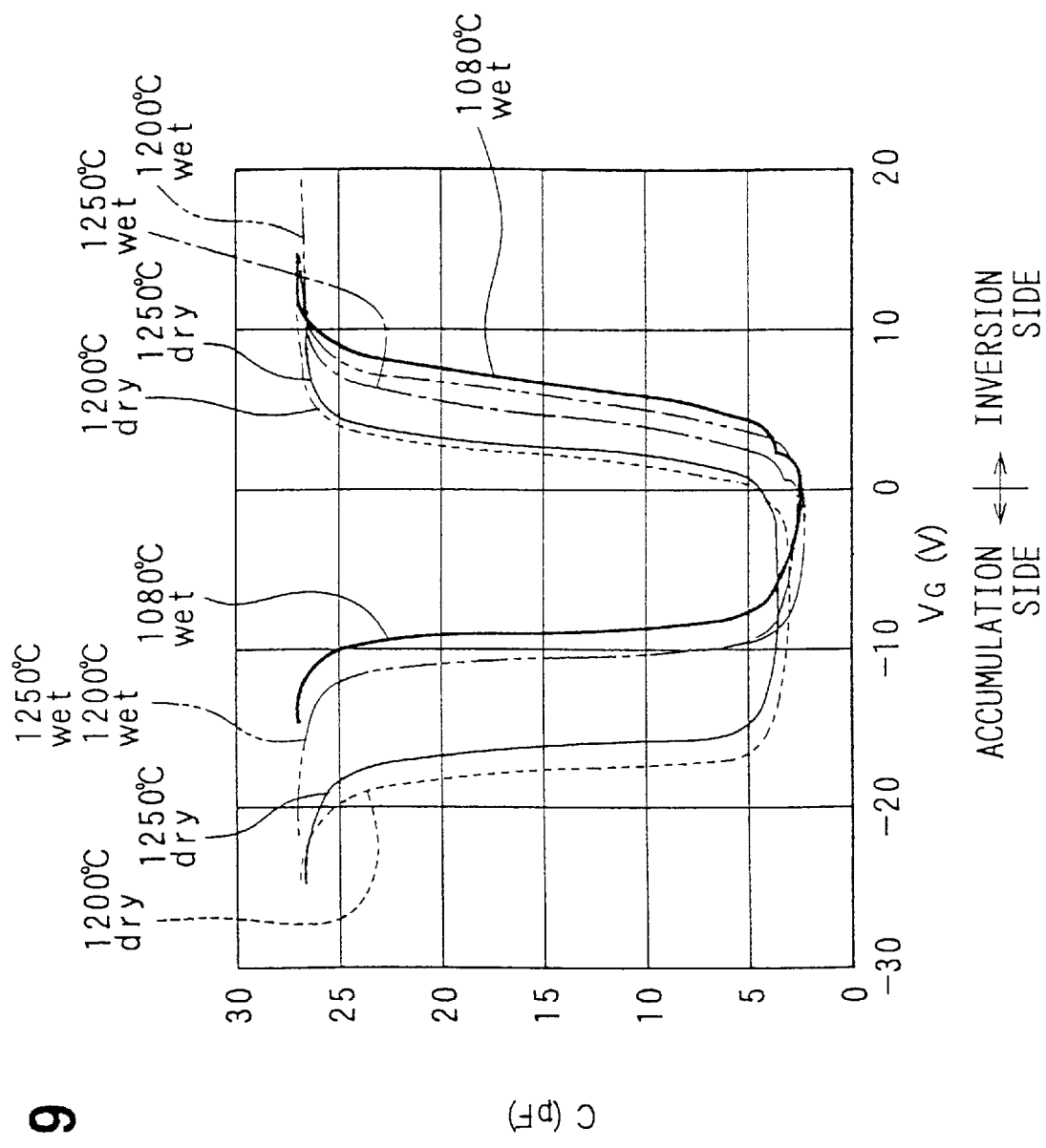
FIG. 9 is a graph showing C-V characteristics of MOS diodes in a fourth preferred embodiment of the present invention.

FIG. 9 shows C-V characteristic data of a MOS diode shown in FIG. 10, and indicates a relationship between the oxidizing atmosphere and the temperature. In FIG. 9, a plus gate voltage side corresponds to an inversion side at which a MOS surface is inverted, and a minus voltage side corresponds to an accumulation side. The MOS diode in this embodiment is so constructed that a p-type epitaxial layer (this is referred to as $p^-$-type epi layer) 201 is formed on a $p^+$-type substrate 200, a source region 202 is formed on the $p^-$-type epi layer 201, and a gate electrode 204 is formed on the $p^-$-type epi layer 201 via a gate oxide film 203 therebetween.

As shown in FIG. 9, in the wet atmosphere, it is revealed that an inversion voltage is lowered as the oxidation temperature is increased. Further, inclinations at 1200° C. and 1250° C. are steeper than that at 1080° C. The inclinations and the inversion voltages are related with the quantity of electron traps at the interface. Specifically, a gentle inclination implies that the voltage applied to the gate electrode is essentially consumed for trapping electrons in electron traps at the interface, and hardly produces the change in potential on the surface of silicon carbide and the change in capacitance relative to the voltage applied to the gate electrode.

The inversion voltage varies depending on the change in quantity of electrons trapped in electron traps. The C-V characteristic curve is shifted in the plus direction of the gate electrode as the quantity of electron trapping is increased. It is considered that the changes in inversion voltage and inclination depending on the oxidation temperature are related with the quantity of electron traps caused by residual carbon in the oxide film and with the quantity of electron traps with OH groups known for Si.

Thus, the reasons why the inversion voltage is decreased when oxidation is performed at a higher temperature and the inclination becomes steeper at 1200° C. or 1250° C. than at 1080° C. are considered because the amount of residual carbon decreases and electron traps of OH groups produced by the wet oxidation is annealed out to be reduced.

On the other hand, the C-V characteristic curves of wet oxidation are in an accumulation state with higher gate electrodes than those of dry oxidation. This confirms that the wet oxidation reduces the quantity of the interface states on the valence band side. This implies that the whole quantity of the interface states of silicon carbide can be reduced and the quantity of trapped charge can also be reduced. For the accumulation side, the reliability of the oxidation apparatus can be further improved by employing wet oxidation.

In addition, in wet oxidation, it has been found that when the oxidation temperature is lowered to 1000° C. or lower, preferably to 950° C. or lower, the gate voltage inducing the accumulation state becomes higher than that in wet oxidation at 1200° C. or 1250° C., and that the quantity of interface states on the valence band side is further lowered at the temperature lower than that described above. This is because the annealing treatment can be performed at conditions under which an oxide film is hardly formed, by lowering temperature to 1000° C. or less, thereby preventing residual carbon from being produced when the oxide film is formed. A combined method of high-temperature oxidation to remove the residual carbon followed by low-temperature oxidation at 1000° C. or lower (hereinafter referred to as re-oxidation method) ensures further reduction in the interface state density on the valance band side.

On the other hand, in dry oxidation, on the inversion side, the inclination at 1250° C. is steeper than that at 1200° C. This is considered as follows. Specifically, in the case of the dry oxidation, unlike the wet oxidation, because electron traps with OH groups formed in the wet oxidation do not exist, the quantity of residual carbon is decreased and accordingly electron traps caused by the residual carbon is also decreased.

In the case of dry oxidation at 1250° C., the accumulation state can be induced at a higher gate voltage than that at 1200° C. This implies that the quantity of the interface states on the valence band side is reduced, which can be considered as an effect reducing hole traps on a valence band side due to the increased temperature for dry oxidation. For the inversion side, therefore, dry oxidation ensures higher reliability of the oxidation apparatus.

Successively, FIG. 11 shows the data of $I_D$-$V_G$ characteristic of a lateral MOSFET having been subjected to wet oxidation at 1080° C. followed by annealing at 1200° C. or 1300° C. in an Ar atmosphere. From this, it is understood that the $I_D$-$V_G$ characteristic of the device is shifted to a minus side and its inclination is steep (at around $1\times10^{10}$ A) by the annealing treatment. It is considered that this is because the annealing treatment can reduce the quantity of residual carbon and the quantity of electron traps by annealing out OH groups. Accordingly, the channel mobility proportional to the inclination of the $I_D$-$V_G$ characteristic curve could be increased.

Besides, the I-V characteristic curve of the device subjected to wet oxidation at 1080° C. but not followed by annealing is compared with that of the device subjected to wet oxidation at 1080° C. followed by annealing at 1300° C., on FIG. 11. It is understood that the amount of the gate electrode change to the minus side almost corresponds to the amount of change in C-V characteristic from that in the wet oxidation at 1080° C. to that in the dry oxidation at 1250° C. on the inversion side shown in FIG. 9. This confirms that annealing performed at 1300° C. or higher can recover the electron traps formed by OH groups in the wet oxidation.

Figure 12:
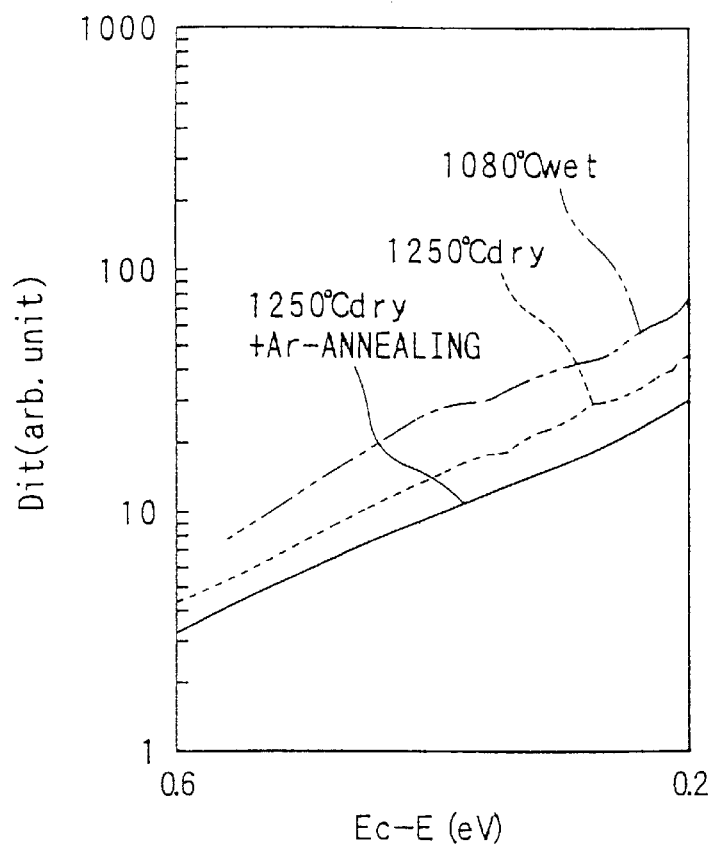
FIG. 12 is a graph showing results obtained by calculating energy distributions of interface state densities.

Another experiment was further conducted in a case of combining the effects of high-temperature oxidation and annealing. Specifically, a gate oxide film was formed on an n-type epitaxial wafer in different methods of oxidation and annealing, and the C-V characteristics of the respective MOS diodes thus prepared were measured. FIG. 12 shows energy distributions of interface state densities that were obtained by calculation using the C-V characteristics. The figure shows three levels of cases where wet oxidation was performed at 1080° C., dry oxidation was performed at 1250° C., and dry oxidation was performed at 1250° C. and followed by an annealing treatment for one hour in an Ar atmosphere at 1250° C.

In all these three cases, the thickness of the oxide film was 40 nm. From the data of these cases, it is understood that the interface state density is reduced in the case of the dry oxidation at 1250° C. as compared to that in the case of the wet oxidation at 1080° C. It is considered this is because electron traps caused by residual carbon are reduced. The Ar annealing treatment additionally performed with the dry oxidation at 1250° C. lowered further the interface state density as compared to that in the case of the dry oxidation at 1250° C. only. It is still considered because the annealing treatment can further reduce the residual carbon to reduce electron traps.

Based on the results and considerations as described above, the method of fabricating the MOSFET in this embodiment is described below. This embodiment is a modification of the first embodiment, and the explanation is presented referring to FIG. 2 to FIG. 4.

As in the first embodiment, the steps shown in FIG. 2A to FIG. 2C and FIG. 3A to FIG. 3C are carried out. Successively, the following step is carried out in place of steps shown in FIG. 4A in the first embodiment.

After the LTO film 22 is removed, the gate oxide film 7 is formed on the substrate by wet oxidation in a water vapor atmosphere. An ambient temperature for this treatment is 1250° C. or higher. When the gate oxide film 7 is formed in this atmosphere, the silicon carbide recrystallization reactions described above can be caused. Accordingly, residual carbon that is formed at the interface between the gate oxide film 7 and the surface channel layer 5 can be reduced during the formation of the gate oxide film 7. In addition, since the wet oxidation is carried out at such a high temperature, OH groups formed by the wet oxidation as electron traps can be reduced by an annealing-out effect.

Accordingly, both electron traps caused by residual carbon and those caused by OH groups can be reduced, an adverse effect due to impurity scattering can be made small, and the ON-resistance can be lowered by improving the channel mobility. Moreover, because the interface state density on the valence band side can be reduced by the wet oxidation performed in the oxidation atmosphere, the whole quantity of trapped charge at the silicon carbide interface can be reduced.

After that, successively, a heat treatment is carried out in a wet oxidation atmosphere at a temperature not higher than 1000° C. In such thermal oxidation at a relatively low temperature of not higher than 1000° C., silicon is oxidized, but silicon carbide is not. Therefore, when the gate oxide film 7 is formed at such a low temperature, only the portion from which carbon is expelled is oxidized, and the gate oxide film 7 can be formed with a further reduced content of carbon.

Then, an annealing treatment is performed in an Ar atmosphere at a temperature not lower than 1250° C., and preferably not lower than 1300° C. Through the annealing treatment that induces the silicon carbide recrystallization reactions, the quantity of residual carbon can be further reduced. In addition, OH groups having been formed in the previous wet oxidation are also reduced by the annealing treatment. As a result, the channel mobility can be further increased, and the ON-resistance can be further lowered.

In case where the heat treatment at 1000° C. or lower is omitted and the annealing treatment and the previous wet oxidation are carried out at the same temperature, it is unnecessary to change the temperature in the oxidation apparatus for the wet oxidation and annealing treatments, and the process can be simplified.

In this embodiment, the wet oxidation and the annealing treatments are carried out at temperatures of 1400° C. or less. This is because, if the temperatures for the treatments exceed 1400° C., the gate oxide film 7 may be transformed into cristobalite. Therefore, the gate oxide film 7 is prevented from being transformed into cristobalite and therefore from being degraded, by controlling the temperature as above.

Next, a $H_2$ annealing treatment is carried out in an atmosphere containing hydrogen ($H_2$) gas, for example, at a temperature of 1000° C. Accordingly, dangling bonds of Si formed at the silicon carbide interface can be terminated with hydrogen, whereby the interface state density can be further reduced, and, in addition, hydrogen atom vacancies produced by the high-temperature oxidation and high-temperature annealing can be prevented. As a result, the channel mobility can be still further enhanced, and the ON-resistance therein can be sill further lowered.

In the manufacturing method described above, the gate oxide film 7 is formed by wet oxidation. However, the same manufacturing method can be applied to the case where gate oxide film 7 may also be formed by dry oxidation as in the manner described hereinabove. Being different from wet oxidation, dry oxidation to form the gate oxide film 7 is free from the problem of electron traps caused by OH groups that are formed in wet oxidation. Therefore, dry oxidation to form the gate oxide film 7 ensures further increase in the channel mobility and further reduction in the ON-resistance.

(Fifth Embodiment)

Figure 13:
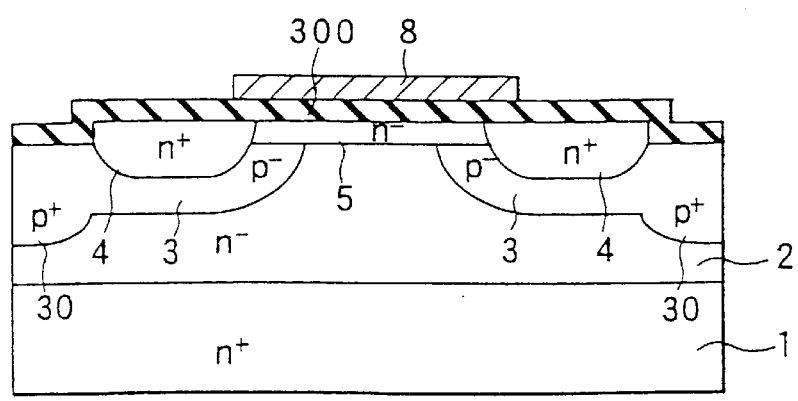
FIG. 13 is a cross-sectional view explanatory of a process for manufacturing a MOSFET mentioned in a fifth preferred embodiment of the present invention.

In this embodiment, the ON-resistance is reduced according to a method that differs from the methods of the second and third embodiments. FIG. 13 shows one method of fabricating a MOSFET according to this embodiment. With reference to this figure, MOSFET fabrication in this embodiment is described. The MOSFET fabrication method in this embodiment is a modification of the first embodiment, and the steps are the same as those in the first embodiment are described with reference to FIGS. 2 to 4.

First, as in the first embodiment, the steps shown in FIG. 2A to FIG. 2C and FIG. 3A to FIG. 3C are carried out. Successively, the following step shown in FIG. 13 is carried out in place of that shown in FIG. 4A explained in the first embodiment.

[Step shown in FIG. 13]

After the LTO film 22 is removed, an LTO film 300 that is to be a gate oxide film is deposited on the substrate in a CVD or LPCVD apparatus. Gas fed into the apparatus in this occasion contains $SiH_4$ and $O_2$, and a temperature for film deposition is 450° C. A deposition rate is relatively low, falling in a range of 1 nm/min to 5 nm/min. By employing the LTO film 300 thus formed, almost 100% yield can be attained at an area size of $\phi 400$ μm. Incidentally, the oxide film is controlled to have a refractive index falling in a range of 1.35 to 1.50. With this constitution, extremely good gate characteristics can be attained.

Then, after the LTO film 300 is deposited, the LTO film 300 is thermally oxidized in an oxygen atmosphere at a temperature in a range of 1250° C. to 1400° C., to thereby improve the LTO/SiC interface. Because the oxidation improves the interface between the LTO film 300 and the surface channel layer 5, the channel mobility is further increased and the ON-resistance is further reduced.

If necessary, the thermal oxidation step may be followed by a heat treatment step performed at a temperature higher than that at the thermal oxidation step, whereby the interface between the LTO film 300 and the surface channel layer 5 can be much more improved. Preferably, the heat treatment step is performed in an Ar atmosphere to ensure better results. Also preferably, the heat treatment step is performed for 5 to 10 minutes to control the oxide film increase to be at most 5 nm whereby the influence of residual carbon could be reduced to a great extent.

In this embodiment, the oxidation temperature for the LTO film 300 after deposition is not lower than 1250° C. However, the oxidation temperature is not limitative. So far as the Gibbs free energy in the chemical formula 4 could be a minus value enough to induce spontaneous recrystallization reactions of silicon carbide during the oxidation treatment, the interface between the LTO film 300 and the surface channel layer 5 can be improved. For example, when the temperature is 1200° C. or more, the Gibbs free energies in both the chemical formulae 4 and 5 become minus values, and efficient improvement can be attained. In this embodiment, the LTO film 300 is oxidized in the $O_2$ atmosphere. However, for the same reasons as described above, the oxidation atmosphere is not limited to that but may be $H_2O$ gas or a mixture of $O_2$ and $H_2O$ as long as the Gibbs free energies in the chemical formulae 4 and 5 could be minus values.

(Sixth Embodiment)

In the first embodiment, the invention is applied to the planar type vertical power MOSFET. As opposed to this, in this embodiment, the invention is applied to a trench gate type vertical power MOSFET.

Figure 14:
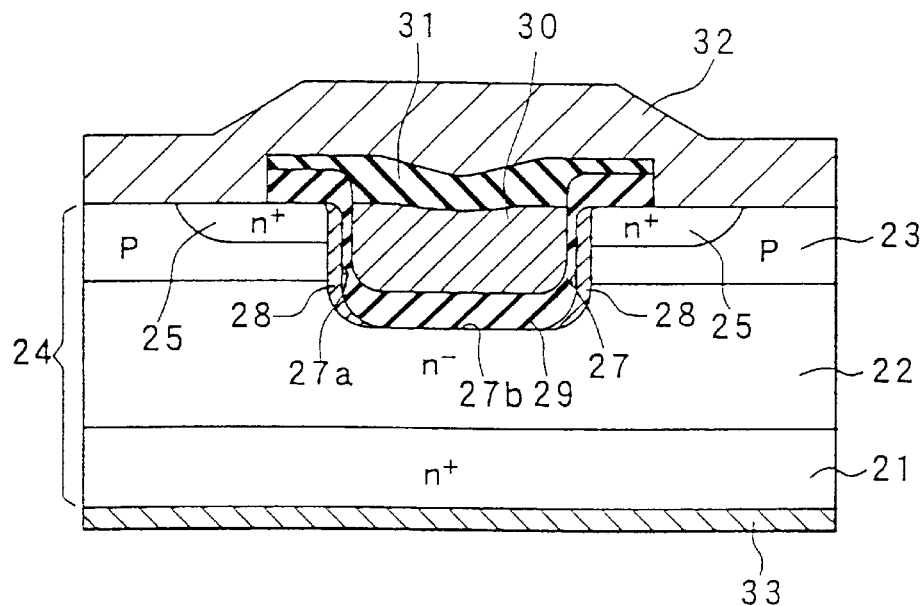
FIG. 14 is a cross-sectional view showing a construction of a MOSFET of trench gate type in a sixth preferred embodiment of the present invention.

FIG. 14 shows a trench gate-type MOSFET. The MOSFET adopts a substrate 24 having a layered structure that is composed of, for example, and an $n^-$-type epi layer 22 and a p-type base layer 23 both layered on an $n^+$-type semiconductor substrate 21.

A recess 27 is formed from the surface of the substrate 24 to pass through a source region 25 (positioned in the surface portion of the p-type base layer 23) and through the p-type base layer 23. A surface channel layer 28 is formed on a side wall 27a of the recess 27. A gate electrode 30 is further formed in the recess 27 via a gate oxide film 29. On the gate electrode 30, a source electrode 32 is formed via an interlayer insulating film 31 and is connected to the source region 25 and the p-type base layer 23. A drain electrode 33 is formed on the back surface of the substrate 24.

In the case of the trench gate type MOSFET having the constitution as described above, the same effects as those in the first embodiment can be realized by controlling the Gibbs free energies for the silicon carbide recrystallization reactions to be negative in the thermal oxidation step performed for forming the gate oxide film 29 and in the annealing treatment performed as required as in the first embodiment.

(Seventh Embodiment)

Figure 15:
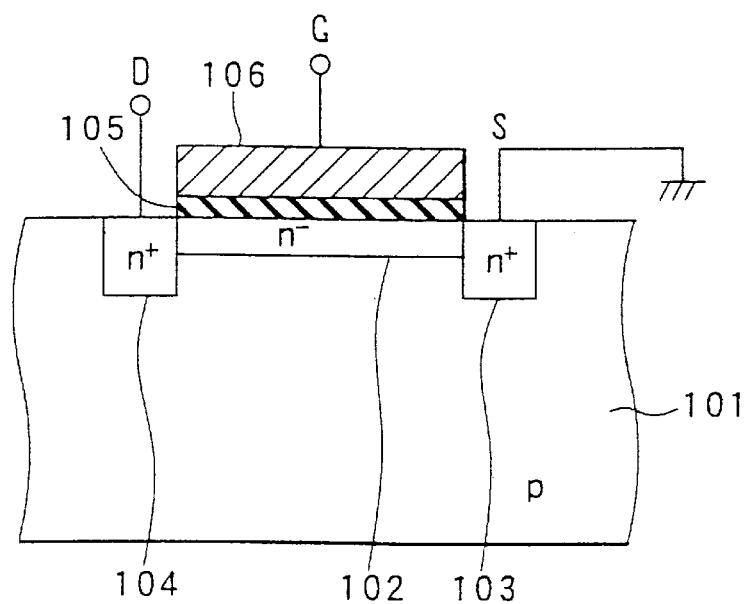
FIG. 15 is a cross-sectional view showing a construction of a MOSFET of lateral type in a seventh preferred embodiment of the present invention.

Ii this embodiment, the invention is applied to a lateral MOSFET. FIG. 15 shows a lateral MOSFET, in which the substrate is, for example, a p-type semiconductor substrate 101. A surface channel layer 102 is formed in a predetermined region of the substrate 101 by ion implantation or the like. On the both sides of the surface channel layer 102, a source layer 103 and a drain layer 104 are formed. A gate electrode is formed on the surface channel layer 102 via a gate oxide film 105 interposed therebetween.

Also in the case of the lateral MOSFET having the constitution as described above, the same effects as those in the first embodiment can be realized by controlling the Gibbs free energies for silicon carbide recrystallization reactions to be negative in the thermal oxidation step for forming the gate oxide film 105 and in the annealing treatment that is performed as required, like in the above-mentioned embodiments.

(Other Embodiments)

In the above-mentioned embodiments, the oxygen mol ratio [$O_2$] in the thermal oxidation atmosphere to form the gate oxide film 7 is set at $10^{-3}$, and the temperature therein is set at 1250° C. However, these are not limitative as long as at least the Gibbs free energy indicated by the chemical formula 4 is negative to cause the silicon carbide recrystallization reaction spontaneously. Accordingly, an amount of residual carbon can be reduced.

For example, as in FIG. 16, when the oxygen mol ratio [$O_2$] in thermal oxidation is $10^{-3}$, the Gibbs free energy in the chemical formula 4 becomes negative at about 800° C. or higher. Therefore, residual carbon can be reduced by setting the temperature at about 800° C. or higher. On the other hand, in this case, as shown in FIG. 17, the temperature at which Gibbs free energy in the chemical formula 5 is negative is about 1200° C. or higher. Therefore, for causing both reactions of the chemical formulae 4 and 5 at the same time, the temperature shall be set at about 1200° C. or higher.

Besides, when the oxygen mol ratio [$O_2$] is set at $10^{-1}$ as shown in FIG. 16, the Gibbs free energy in the chemical formula 4 is negative at about 1000° C. or higher. Therefore, residual carbon can be reduced by controlling the temperature to be about 1000° C. or higher. In this case, when the temperature is about 1500° C. or higher, as in FIG. 17, both reactions of the chemical formulae 4 and 5 can be induced at the same time. However, in order to keep the gate oxide film 7 amorphous without forming cristobalite, the annealing treatment should be performed at a temperature not higher than about 1400° C. From this viewpoint, it is preferable that the oxygen mol ratio [$O_2$] in thermal oxidation is set at $10^{-3}$.

In the above-mentioned embodiments, the gate oxide film 7 is formed by dry oxidation, which, however, is not limitative. The gate oxide film 7 may also be formed by wet oxidation to reduce residual carbon. For example, the gate oxide film 7 may be formed by wet oxidation in a water vapor atmosphere (including pyrogenic oxidation method using $H_2+O_2$). A mixed gas of hydrogen and oxygen may also be used. Otherwise, water vapor or a mixed gas of hydrogen and oxygen may be mixed with an inert gas (e.g., nitrogen, argon, helium, etc.) for use herein.

Also, the thermal oxidation and annealing treatments may be performed with a temperature gradient condition of such that the temperature of the back surface of the gate oxide film 7 (the surface at the side of the surface channel layer 5) is higher than that of the main surface thereof. For example, the thermal oxidation and annealing treatments may be performed in such a manner that the temperature of the back surface of the $n^+$-type substrate 1 is higher than that of the main surface of the gate oxide film 7.

By controlling the temperature of the main surface of the gate oxide film 7 to be lower than that of the back surface of the substrate, the temperature of the interface between the gate oxide film 7 and the surface channel layer 5 could be higher than that of the gate oxide film 7 itself. Accordingly, it becomes possible to reduce residual carbon at the interface between the gate oxide film 7 and the surface channel layer 5 with the gate oxide film 7 being prevented from being degraded (from being transformed into cristobalite).

In the above-mentioned embodiments, the invention is applied to accumulation-type planar gate, trench gate or lateral gate MOSFETs, which, however, are not whatsoever intended to restrict the scope of the invention. The invention can be applied to any other semiconductor device structure having an oxide film formed on silicon carbide.

For example, the invention can also be applied to a case of reducing residual carbon at an interface between silicon carbide and an element isolating oxide film formed on a silicon carbide substrate for isolating several elements. Such an element isolating oxide film is, for example, a LOCOS oxide film formed by LOCOS oxidation, an STI film formed to be embedded in a recess on a surface of a silicon carbide substrate (or on a surface of a silicon carbide epitaxial layer formed on the surface of the silicon carbide substrate), or the like. An element isolating withstand voltage can be enhanced by reducing the residual carbon at the interface between the element isolating oxide film and the silicon carbide.

In case where several MOSFETs of any of the above-mentioned first to seventh embodiments are disposed and a guard ring is provided to surround an outer periphery of a cell region, an oxide film shall be disposed on an impurity layer constituting the guard ring. For example, in the case of the MOSFETs in the first to third embodiments, several p-type layers serving as guard rings shall be disposed at a predetermined interval in the surface portion of the $n^-$-type epi layer 2. The present invention is also effective for reducing residual carbon at the interface between silicon carbide and the oxide film in such a region in which the guard rings are formed. In this case, the withstand voltage at the region in which the guard rings are formed can also be enhanced.

Further, in the second embodiment described above, the temperature is lowered after the thermal oxidation or annealing treatment is performed to form the gate oxide film 7 in combination with the conditions under which the silicon carbide recrystallization reactions of the chemical formulae 4 and 5 are induced simultaneously as in the first embodiment. However, substantially the same effects can be attained even at conditions under which a silicon carbide recrystallization reaction of any one of the chemical formulae is induced.

That is, because it is believed that the channel mobility is much influenced by residual carbon especially at the interface between the gate oxide film 7 and the surface channel layer 5 of the gate oxide film 7, decrease in residual carbon only at the interface between them is enough for improving the channel mobility and for reducing the ON-resistance.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for manufacturing a silicon carbide semiconductor device, comprising:

preparing a substrate having a semiconductor layer made of silicon carbide; and forming an oxide film on the semiconductor layer by a thermal oxidation treatment performed at conditions under which a first recrystallization reaction between silicon dioxide ($SiO_2$) and carbon (C) occurs to produce silicon carbide (SiC) with a Gibbs free energy $G_3$ being negative, the first recrystallization reaction being expressed by a chemical formula of:

$$SiO_2 + 3C \rightarrow SiC + 2CO + G_3,$$

wherein the thermal oxidation treatment is performed at the conditions under which an oxygen mol ratio [$O_2$] with respect to a standard state fulfils an equation of:

$$624.96 \times 10^3 - 354.23(T+273) + 2R(T+273)\ln[O_2] \leq 0$$

in which T denotes a temperature Celsius, and R denotes a gas constant.

2. The method according to claim 1, wherein the thermal oxidation treatment is performed at the conditions under which an oxygen mol ratio $[O_2]$ with respect to a standard state fulfils an equation of:

$$452.59 \times 10^3 - 173.24(T+273) + R(T+273)\ln[O_2] \leq 0$$

in which T denotes a temperature Celsius, and R denotes a gas constant.

3. The method according to claim 1, wherein the forming the oxide film comprises performing the thermal oxidation treatment at a temperature of 1200° C. or higher.

4. The method according to claim 1, further comprising controlling an increase in a thickness of the oxide film formed after performing the thermal oxidation treatment to be 6 nm at most.

5. The method according to claim 4, wherein the oxide film is formed by performing the thermal oxidation treatment and by cooling the substrate to 900° C. or lower within 10 minutes after performing the thermal oxidation treatment.

6. The method according to claim 1, wherein the forming of an oxide film on the semiconductor layer by a thermal oxidation treatment is performed by on of wet oxidation and dry oxidation at a temperature in a range of 1250° C. to 1400° C.

7. The method according to claim 1, wherein the substrate having the semiconductor layer is prepared by:

preparing a first conductivity type semiconductor substrate;

forming second conductivity type source and drain regions in a surface portion of the semiconductor substrate, separately from each other; and forming a second conductivity type surface channel layer as the semiconductor layer made of silicon carbide on the semiconductor substrate to connect the source and drain regions therebetween, wherein:

a gate oxide film is formed as the oxide film on the surface channel layer by the thermal oxidation treatment;

a gate electrode is formed on the gate oxide film; and source and drain electrodes are formed to be connected with the source and drain regions, respectively.

8. The method according to claim 1, wherein the substrate having the semiconductor layer is prepared by:

preparing a first conductivity type semiconductor substrate made of silicon carbide having a principal surface and a back surface;

forming a first conductivity type semiconductor layer on the principal surface of the semiconductor substrate, the first conductivity type semiconductor layer made of silicon carbide and having a resistance higher than that of the semiconductor substrate;

forming a second conductivity type base region in a surface portion of the first conductivity semiconductor layer;

forming a first conductivity type source region in a surface portion of the base region; and forming a first conductivity type surface channel layer for connecting the source region and the first conductivity type semiconductor layer, wherein;

a gate oxide film is formed as the oxide film on the surface channel layer by the thermal oxidation treatment;

a gate electrode is formed on the gate oxide film; and base and source electrodes are formed to respectively connect the base and source regions.

9. The method according to claim 1, wherein:

the preparing of a substrate having guard ring surrounding an element formed at a cell region on the substrate; and the forming of an oxide film comprises forming an oxide film on the guard ring.

10. The method according to claim 1, wherein:

the preparing of a substrate comprises preparing a substrate having a plurality of elements formed therein; and the forming of an oxide film comprises forming an oxide film on the semiconductor film of the substrate by the thermal oxidation treatment to electrically isolate the plurality of elements from each other.

11. The method according to claim 5, wherein the performing of the thermal oxidation treatment and the cooling of the substrate are performed by a lamp heating unit.

12. The method according to claim 5, wherein the cooling of the substrate comprises spraying cooling gas to the substrate.

13. The method according to claim 1, wherein the forming of an oxide film comprises performing a first annealing treatment at a temperature equal to or lower than 1000° C., after performing the thermal oxidation treatment.

14. The method according to claim 1, wherein the forming of an oxide film comprises performing a second annealing treatment at a temperature equal to or higher than 1250° C., after performing the thermal oxidation treatment and the first annealing treatment.

15. The method according to claim 14, wherein the performing of a second annealing treatment is performed at the temperature equal to or higher than 1300° C.

16. The method according to claim 14, wherein the performing of a thermal oxidation treatment and the performing of a the second annealing treatment are performed at an approximately identical temperature.

17. The method according to claim 1, wherein the forming of an oxide film comprises performing a $H_2$ annealing treatment in an atmosphere including a $H_2$ gas after performing the thermal oxidation treatment.

18. A method for manufacturing a silicon carbide semiconductor device, comprising:

preparing a substrate having a semiconductor layer made of silicon carbide;

depositing an oxide film on a surface of the semiconductor layer; and performing a thermal oxidation treatment to the semiconductor layer and the oxide film, wherein the thermal oxidation treatment is performed at the conditions under which an oxygen mol ratio $[O_2]$ with respect to a standard state fulfils an equation of:

$$624.96 \times 10^3 - 354.23(T+273) + 2R(T+273)\ln[O_2] \leq 0$$

in which T denotes a temperature Celsius, and R denotes a gas constant.

19. The method according to claim 18, further comprising, after the thermal oxidation treatment, performing an annealing treatment at a temperature equal to or higher than the temperature for the thermal oxidation treatment.

20. The method according to claim 18, wherein the thermal oxidation treatment is performed in one of an $O_2$ atmosphere, an $H_2O$ atmosphere, and a mixed gas atmosphere of $O_2$ and $H_2O$.

21. The method according to claim 18, wherein the depositing of an oxide film comprises depositing an oxide film on the semiconductor layer by one of a CVD method and an LPCVD method.

22. The method according to claim 18, wherein the depositing of an oxide film comprises depositing an oxide film on the semiconductor layer at a deposition rate in a range of 1 nm/min to 5 nm/min.

23. A method for manufacturing a silicon carbide semiconductor device, comprising:
   preparing a substrate having a semiconductor layer made of silicon carbide; and
   forming an oxide film on the semiconductor layer by a thermal oxidation treatment performed at conditions under which a first recrystallization reaction between silicon dioxide ($SiO_2$) and carbon (C) occurs to produce silicon carbide (SiC) with a Gibbs free energy $G_3$ being negative, the first recrystallization reaction being expressed by a chemical formula of:

$$SiO_2 + 3C \rightarrow SiC + 2CO + G_3,$$

wherein the thermal oxidation treatment is performed at the conditions under which a water-vapor mol ratio [$H_2O$] with respect to a standard state fulfils an equation of:

$$624.96 \times 10^3 - 354.23(T+273) + 2R(T+273)\ln[H_2O] \leq 0$$

in which T denotes a temperature Celsius, and R denotes a gas constant.

24. The method according to claim 23, wherein the performing of a thermal oxidation treatment comprises performing at the conditions under which an oxygen mol ratio [$H_2O$] with respect to a standard state fulfils an equation of:

$$452.59 \times 10^3 - 173.24(T+273) + R(T+273)\ln[H_2O] \leq 0$$

in which T denotes a temperature Celsius, and R denotes a gas constant.

25. The method according to claim 23, wherein the forming of the oxide film comprises performing the thermal oxidation treatment at a temperature of 1200° C. or higher.

26. The method according to claim 23, further comprising controlling an increase in a thickness of the oxide film formed after performing the thermal oxidation treatment to be 6 nm at most.

27. The method according to claim 26, further comprising forming the oxide film by performing the thermal oxidation treatment and by cooling the substrate to 900° C. or lower within 10 minutes after performing the thermal oxidation treatment.

28. The method according to claim 23, wherein the forming of an oxide film on the semiconductor layer by a thermal oxidation treatment is performed by one of wet oxidation and dry oxidation at a temperature in a range of 1250° C. to 1400° C.

29. The method according to claim 23, wherein the preparing of a substrate having the semiconductor layer comprises:
   preparing a first conductivity type semiconductor substrate;
   forming second conductivity type source and drain regions in a surface portion of the semiconductor substrate, separately from each other; and
   forming a second conductivity type surface channel layer as the semiconductor layer made of silicon carbide on the semiconductor substrate to connect the source and drain regions therebetween, wherein:
      a gate oxide film is formed as the oxide film on the surface channel layer by the thermal oxidation treatment;
      a gate electrode is formed on the gate oxide film; and
      source and drain electrodes are formed to be connected with the source and drain regions, respectively.

30. The method according to claim 23, wherein the substrate having the semiconductor layer is prepared by:
   preparing a first conductivity type semiconductor substrate made of silicon carbide having a principal surface and a back surface;
   forming a first conductivity type semiconductor layer on the principal surface of the semiconductor substrate, the first conductivity type semiconductor layer made of silicon carbide and having a resistance higher than that of the semiconductor substrate;
   forming a second conductivity type base region in a surface portion of the first conductivity semiconductor layer;
   forming a first conductivity type source region in a surface portion of the base region; and
   forming a first conductivity type surface channel layer for connecting the source region and the first conductivity type semiconductor layer, wherein;
      a gate oxide film is formed as the oxide film on the surface channel layer by the thermal oxidation treatment;
      a gate electrode is formed on the gate oxide film; and
      base and source electrodes are formed to respectively connect the base and source regions.

31. The method according to claim 23, wherein:
   the preparing of a substrate having guard ring surrounding an element formed at a cell region on the substrate; and
   the forming of an oxide film comprises forming an oxide film on the guard ring.

32. The method according to claim 23, wherein:
   the preparing of a substrate comprises preparing a substrate having a plurality of elements formed therein; and
   the forming of an oxide film comprises forming an oxide film on the semiconductor film of the substrate by the thermal oxidation treatment to electrically isolate the plurality of elements from each other.

33. The method according to claim 27, wherein the performing of thermal oxidation treatment and the cooling of the substrate step are performed by a lamp heating unit.

34. The method according to claim 27, wherein the cooling step is performed by spraying cooling gas to the substrate.

35. The method according to claim 23, wherein the forming of an oxide film comprises performing a first annealing treatment at a temperature equal to or lower than 1000° C., after performing the thermal oxidation treatment.

36. The method according to claim 23, wherein the forming of an oxide film comprises performing a second annealing treatment at a temperature equal to or higher than 1250° C., after performing the thermal oxidation treatment and the first annealing treatment.

37. The method according to claim 36, wherein the performing of a second annealing treatment is performed at the temperature equal to or higher than 1300° C.

38. The method according to claim 36, wherein the performing of a thermal oxidation treatment and the performing of a second annealing treatment are performed at an approximately identical temperature.

39. The method according to claim 23, wherein the performing of an oxide film comprises performing a $H_2$ annealing treatment in an atmosphere including a $H_2$ gas after performing the thermal oxidation treatment.

40. A method for manufacturing a silicon carbide semiconductor device, comprising:

preparing a substrate having a semiconductor layer made of silicon carbide;

depositing an oxide film on a surface of the semiconductor layer; and performing a thermal oxidation treatment to the semiconductor layer and the oxide film, wherein the thermal oxidation treatment is performed at the conditions under which an oxygen mol ratio [$H_2O$] with respect to a standard state fulfils an equation of:

$$624.96 \times 10^3 - 354.23(T+273) + 2R(T+273)\ln[H_2O] \leq 0$$

in which T denotes a temperature Celsius, and R denotes a gas constant.

41. The method according to claim 40, further comprising, after the thermal oxidation treatment, performing an annealing treatment at a temperature equal to or higher than the temperature for the thermal oxidation treatment.

42. The method according to claim 40, wherein the performing of a thermal oxidation treatment is performed in one of an $O_2$ atmosphere, an $H_2O$ atmosphere, and a mixed gas atmosphere of $O_2$ and $H_2O$.

43. The method according to claim 40, wherein the depositing of an oxide film comprises depositing an oxide film on the semiconductor layer by one of a CVD method and an LPCVD method.

44. The method according to claim 40, wherein the depositing of an oxide film comprises depositing an oxide film on the semiconductor layer at a deposition rate in a range of 1 nm/min to 5 nm/min.

* * * * *